United States Patent [19]

Hanson

[11] 4,342,027
[45] Jul. 27, 1982

[54] RADIX CONVERSION SYSTEM

[75] Inventor: Lawrence G. Hanson, Temple City, Calif.

[73] Assignee: Burroughs Corporation, Detroit, Mich.

[21] Appl. No.: 174,431

[22] Filed: Aug. 1, 1980

Related U.S. Application Data

[63] Continuation-in-part of Ser. No. 156,201, Jun. 3, 1980.

[51] Int. Cl.³ .............................................. G06F 5/02
[52] U.S. Cl. .............................. 340/347 DD; 235/311
[58] Field of Search ............................... 235/210, 211; 340/347 DD

[56] References Cited

U.S. PATENT DOCUMENTS

| | | | |
|---|---|---|---|
| 3,018,955 | 1/1962 | Mendelson | 235/311 |
| 3,151,238 | 9/1964 | Symons | 235/311 |
| 3,373,269 | 3/1968 | Rathbun | 235/311 |
| 3,611,349 | 10/1971 | Chinal | 235/311 |
| 3,624,375 | 11/1971 | Pross | 235/311 |
| 3,736,412 | 5/1973 | Wright | 235/311 |

*Primary Examiner*—Charles D. Miller
*Attorney, Agent, or Firm*—Nathan Cass; Kevin R. Peterson; David G. Rasmussen

[57] ABSTRACT

Radix conversion apparatus which converts an input number in a first number system into an equivalent output number in a second number system by performing a plurality of successive divisions in accordance with a divide-by-radix iterative equation. A plurality of serial dividers are provided for performing the successive divisions required by the divide-by-radix iterative equation in a manner such that each division is serially performed beginning with the most significant input dividend digit and each output quotient is serially produced beginning with the most significant output quotient digit. The serial dividers are successively arranged so that each can begin its respective division as soon as the first quotient digit is produced by the previous serial divider.

11 Claims, 16 Drawing Figures

FIG. 2.

| FIG.2A. |
|---|
| FIG.2B. |

FIG. 2A.

| CLOCK PERIOD | ODD SERIAL DIVIDER 115 | | | | EVEN SERIAL DIVIDER 120 | | | | CONTROL SIGNALS | | | CONVERTED DIGITS |
|---|---|---|---|---|---|---|---|---|---|---|---|---|
| | $f_{k-1}$ | $d_k$ | $g_k$ | $f_k$ | $f_{k-1}$ | $d_k$ | $g_k$ | $f_k$ | $G_4$ | $G_5$ | $G_6$ | $b_j$ |
| $C_1$ | X | X | X | X | X | X | X | X | X | X | X | X |
| $C_2$ | 0 | 4 | 2 | 0 | X | X | X | X | 0 | 0 | 0 | X |
| $C_3$ | 0 | 7 | 3 | 1 | 0 | 2 | 1 | 0 | 0 | 0 | 0 | X |
| $C_4$ | 1 | 3 | 6 | 1=$b_1$ | 0 | 3 | 1 | 1 | 0 | 0 | 0 | X |
| $C_5$ | 0 | 1 | 0 | 1 | 0 | 6 | 8 | 0=$b_2$ | 1 | 1 | 1 | $b_1$=1 |
| $C_6$ | 1 | 1 | 5 | 1 | 0 | 0 | 0 | 0 | 1 | 1 | 1 | $b_2$=0 |
| $C_7$ | 1 | 8 | 9 | 0=$b_3$ | 0 | 5 | 2 | 1 | 1 | 1 | 1 | X |
| $C_8$ | 0 | 0 | 0 | 0 | 0 | 9 | 9 | 1=$b_4$ | 1 | 1 | 1 | $b_3$=0 |
| $C_9$ | 0 | 2 | 1 | 0 | 1 | 0 | 0 | 0 | 1 | 1 | 1 | $b_4$=1 |
| $C_{10}$ | 0 | 9 | 4 | 1=$b_5$ | 0 | 1 | 0 | 1 | 1 | 1 | 1 | X |
| $C_{11}$ | 0 | 0 | 0 | 0 | 0 | 4 | 7 | 0=$b_6$ | 1 | 1 | 1 | $b_5$=1 |
| $C_{12}$ | 0 | | | | | | | | | | | |

| CLOCK PERIOD | FIRST SERIAL DIVIDER | | | | SECOND SERIAL DIVIDER | | | | THIRD SERIAL DIVIDER | | | | CONVERTED DIGITS |
|---|---|---|---|---|---|---|---|---|---|---|---|---|---|
| | $f_{k-1}$ | $d_k$ | $g_k$ | $f_k$ | $f_{k-1}$ | $d_k$ | $g_k$ | $f_k$ | $f_{k-1}$ | $d_k$ | $g_k$ | $f_k$ | $b_j$ |
| $C_1$ | X | X | X | X | X | X | X | X | X | X | X | X | X |
| $C_2$ | 0 ($Q_0$) | 4 | 2 | 0 | X | X | X | X | X | X | X | X | X |
| $C_3$ | 0 | 7 | 3 | 1 ($b_1$) | X ($Q_1$) | 2 | 1 | 0 | X | X | X | X | X |
| $C_4$ | 1 | 3 | 6 | 0 | X | 3 | 8 | 0 | X | X | X | X | X |
| $C_5$ | 0 ($Q_3$) | 0 | 0 | 1 ($b_4$) | 0 ($Q_2$) | 6 | 0 | 1 ($b_2$) | X ($Q_2$) | 1 | 1 | 1 ($b_3$) | $b_1=1$ |
| $C_6$ | 0 | 5 | 2 | 0 | 0 | 2 | 0 | 0 | 0 | 1 | 5 | 0 | $b_2=0$ |
| $C_7$ | 1 ($Q_6$) | 9 | 9 | 0 ($Q_4$) | 0 ($Q_5$) | 9 | 4 | 0 ($b_5$) | 0 ($Q_5$) | 8 | 9 | 0 ($Q_6$) | $b_3=0$ |
| $C_8$ | 0 | 0 | 0 | 1 ($b_7$) | 0 | 0 ($Q_7$) | 0 ($Q_8$) | 0 | 0 | 1 ($Q_8$) | 0 | 1 | $b_4=1$ |
| $C_9$ | 0 | 0 | 0 | 0 | 0 | 0 | 0 | 0 | 0 | 4 | 7 | 1 ($b_6$) | $b_5=1$ |
| $C_{10}$ | 0 | 7 | 3 | 1 | 0 | 0 | 0 | 0 | 0 | 0 | 0 ($Q_9$) | 0 | $b_6=0$ |

FIG. 4.

| CLOCK PERIOD | ODD SERIAL DIVIDER 115 | | | | EVEN SERIAL DIVIDER 120 | | | | CONTROL SIGNALS | | | | CONVERTED DIGITS |
|---|---|---|---|---|---|---|---|---|---|---|---|---|---|
| | $f_{k-1}$ | $d_k$ | $g_k$ | $f_k$ | $f_{k-1}$ | $d_k$ | $g_k$ | $f_k$ | $G_4$ | $G_5$ | $G_6$ | | $b_j$ |
| $C_1$ | X | X | X | X | X | X | X | X | X | X | X | | X |
| $C_2$ | 0 | 4 | 0 | 4 | X | X | X | X | 0 | 0 | 0 | | X |
| $C_3$ | 4 | 7 | 2 | F | X | X | X | X | 0 | 0 | 0 | | X |
| $C_4$ | F | 3 | 9 | 9 | 0 | 0 | 0 | 0 | 0 | 0 | 0 | | X |
| $C_5$ | 0 | 0 | 0 | 0 | 0 | 2 | 9 | 2 | 1 | 1 | 0 | | $b_1=9=1001$ |
| $C_6$ | 0 | 0 | 0 | 0 | 2 | 0 | 1 | D | 1 | 0 | 1 | | $b_2=D=1101$ |
| $C_7$ | 0 | 0 | 0 | 1 | X | X | X | X | 1 | 0 | 0 | | X |
| $C_8$ | X | X | X | X | X | X | X | X | X | 1 | X | | $b_3=1=0001$ |

FIG. 9.

| | $P_0$ | $P_1$ | $P_2$ | $P_3$ | $P_4$ | $P_5$ | $P_6$ | $P_7$ | $P_8$ | $P_9$ | $P_{10}$ | $P_{11}$ | $P_{12}$ | $P_{13}$ | $P_{14}$ | $P_{15}$ |
|---|---|---|---|---|---|---|---|---|---|---|---|---|---|---|---|---|
| AQW 156 | 00 | 00 | 00 | FF | FF | FF | FF | FE | FE | FE | FE | FD | FD | FD | FD | FD |
| AQA 155 | 00 | 00 | 00 | FF | FF | FF | FF | FE | FE | FE | FE | FD | FD | FD | FD | FD |
| AQP 157 | FD | FD | FD | FD | FD | FD | FD | FD | FD | FD | FD | FD | FD | FD | FD | FD |
| BQW 171 | 00 | 00 | 00 | 00 | 00 | 00 | 00 | 00 | 00 | 00 | 00 | 00 | 00 | 00 | 00 | 00 |
| BQP 173 | FF | FF | FF | 00 | 00 | FF | FF | 00 | 00 | FF | FF | 00 | 00 | FF | FF | FF |
| CQW 134 | 01 | 01 | 01 | FF | FF | 00 | 00 | FF | FF | 00 | 00 | FF | FF | 00 | 00 | 00 |
| CQA 132 | 01 | 01 | 01 | FF | FF | 00 | 00 | FF | FF | 00 | 00 | FF | FF | 00 | 00 | 00 |
| CQP 135 | FF | FF | 00 | 00 | FF | FF | 00 | 00 | FF | FF | 00 | 00 | FF | FF | FF | FF |

← CNV PERIOD →

| PERIOD | GATE 145 INPUT | PROM 115 INPUT dk | PROM 115 INPUT fk-1 | PROM 115 OUTPUT gk | PROM 115 OUTPUT fk | REGISTER 117 BQIU | REGISTER 117 BQIL | GATE 151 INPUT | PROM 119 INPUT dk | PROM 119 INPUT fk-1 | PROM 119 OUTPUT gk | PROM 119 OUTPUT fk |
|---|---|---|---|---|---|---|---|---|---|---|---|---|
| P0  | X | X | X | X | X | X | X | X | X | X | X | X |
| P1  | X | X | X | X | X | X | X | X | X | X | X | X |
| P2  | X | 0 | 0 | 0 | 0 | X | X | X | X | X | X | X |
| P3  | 0 | 0 | 1 | 0 | 1 | 0 | 0 | X | 0 | 0 | 0 | 0 |
| P4  | 1 | 1 | D | 2 | 9 | 0 | 1 | 0 | 0 | 0 | 0 | 0 |
| P5  | 9 | 9 | 9 | F | 3 | 2 | 9 | 0 | 0 | 2 | 0 | 2 |
| P6  | 3 | 0 | 0 | 0 | 0 | F | 3 | 2 | 2 | F | 4 | 7 |
| P7  | 0 | 0 | 0 | 0 | 0 | 0 | 0 | 7 | 0 | 0 | 0 | 0 |
| P8  | 0 | 0 | 0 | 0 | 0 | 0 | 0 | 0 | 0 | 0 | 0 | 0 |
| P9  | 0 | 0 | 4 | 0 | 4 | 0 | 0 | 0 | 0 | 0 | 0 | 0 |
| P10 | 4 | 0 | 0 | 0 | 0 | 0 | 4 | 0 | 0 | 0 | 0 | 0 |
| P11 | 0 | 0 | 0 | 0 | 0 | 0 | 0 | 0 | 0 | 0 | 0 | 0 |
| P12 | 0 | 0 | 0 | 0 | 0 | 0 | 0 | 0 | 0 | 0 | 0 | 0 |
| P13 | 0 | 0 | 0 | 0 | 0 | 0 | 0 | 0 | 0 | 0 | 0 | 0 |
| P14 | 0 | 0 | 0 | 0 | 0 | 0 | 0 | 0 | 0 | 0 | 0 | 0 |
| P15 | 0 | 0 | 0 | 0 | 0 | 0 | 0 | 0 | 0 | 0 | 0 | 0 |
| P16 | 0 | 0 | 0 | 0 | 0 | 0 | 0 | 0 | 0 | 0 | 0 | 0 |
| P17 | X | X | X | X | X | X | X | X | X | X | X | X |

CNV spans P2–P16

FIG.10B.

| OUTPUT | CQI 131 | | CQ RAM 136 | | | CQO 133 | | MUX 143 | CVR REG.153 | AQI 149 | | AQ RAM 159 | |
|---|---|---|---|---|---|---|---|---|---|---|---|---|---|
| fk | CQIU | CQIL | INPUT | ADDR. | OUTPUT | CQOU | CQOL | OUTPUT | OUTPUT | AQIU | AQIL | INPUT | ADDR. |
| X | X | X | XX | 01/FF | 01 | X | X | X | X | X | X | XX | 00 |
| X | X | X | XX | 01/FF | 01 | X | X | X | X | X | X | XX | 00 |
| X | X | X | XX | 01/FF | 01 | 0 | 1 | 0 | X | X | X | XX | 00 |
| 0 | X | X | XX | 01/00 | D9 | 0 | 1 | 1 | X | X | X | XX | 00 |
| 0 | X | 0 | X0 | FF/FF | D9 | D | 9 | D | 0 | 0 | 0 | 00 | FF |
| 2 | 0 | 0 | 00 | 00/00 | 00 | D | 9 | 9 | 0 | 0 | 1 | 01 | FF |
| 7 | 0 | 0 | 00 | 00/FF | 00 | 0 | 0 | 0 | 0 | 2 | 9 | 29 | FF |
| 0 | 0 | 4 | 04 | 00/00 | 04 | 0 | 0 | 0 | 4 | 7 | 3 | 73 | FF |
| 0 | 4 | 0 | 40 | FF/00 | 04 | 0 | 4 | 0 | 0 | 0 | 0 | 00 | FE |
| 0 | 0 | 0 | 00 | FF/FF | 00 | 0 | 4 | 4 | 0 | 0 | 0 | 00 | FE |
| 0 | 0 | 0 | 00 | 00/FF | 00 | 0 | 0 | 0 | 0 | 0 | 0 | 00 | FE |
| 0 | 0 | 0 | 00 | 00/00 | 00 | 0 | 0 | 0 | 0 | 0 | 4 | 04 | FE |
| 0 | 0 | 0 | 00 | FF/00 | 00 | 0 | 0 | 0 | 0 | 0 | 0 | 00 | FD |
| 0 | 0 | 0 | 00 | FF/FF | 00 | 0 | 0 | 0 | 0 | 0 | 0 | 00 | FD |
| 0 | 0 | 0 | 00 | 00/FF | 00 | 0 | 0 | 0 | 0 | 0 | 0 | 00 | FD |
| 0 | 0 | 0 | 00 | 00/00 | 00 | 0 | 0 | 0 | 0 | 0 | 0 | 00 | FD |
| 0 | 0 | 0 | 00 | FF/00 | 00 | 0 | 0 | 0 | 0 | 0 | 0 | 00 | FC |
| X | X | X | XX | FF/FF | XX | X | X | X | X | X | X | XX | FC |

RADIX CONVERSION SYSTEM

This application is a continuation-in-part of my copending, commonly assigned patent application Ser. No. 156,201, filed June 3, 1980.

CROSS REFERENCE TO RELATED APPLICATION

My commonly assigned Patent Application Ser. No. 156,201, filed June 3, 1980, for Number Conversion Apparatus is related to this application.

BACKGROUND OF THE INVENTION

This invention relates to improved means and methods for translating between different number systems employed in a data processor.

As is well known, digital computers typically require means and methods for converting between different number systems. Conversions between binary coded decimal numbers and binary numbers, and vice versa, are probably the most frequent types of conversions required.

In the binary system of notation, each binary digit (bit) represents a different power of 2. For example, in binary notation, the binary number 11101 is equal to $1 \times 2^4 + 1 \times 2^3 + 1 \times 2^2 + 0 \times 2^1 + 1 \times 2^0 = 29$. In the binary coded decimal (BCD) system of notation, each decimal number is represented by a corresponding binary code of four binary bits. Thus, the above decimal number 29 is represented in BCD notation as 0010 1001 where 0010=2 and 1001=9.

Various known approaches for providing number conversions and, in particular, BCD to binary and/or binary to BCD conversions, are described and referenced in the articles: "A Method for High Speed BCD-to-Binary Conversion", L. C. Beougher, Computer Design, March 1973, pp. 53–59; and "Binary-to-BCD Conversion with Complex IC Functions", J. R. Linford, Computer Design, September 1970, pp. 53–61.

SUMMARY OF THE INVENTION

In a preferred embodiment in accordance with the invention, a particularly advantageous serial division conversion approach is employed which permits use of a remarkably simple and economical implementation that provides a high degree of time sharing while also being readily adaptable for use in converting between a plurality of number systems having different bases.

The specific nature of the invention as well as other features, objects, advantages and uses thereof will become readily evident from the following description of a preferred embodiment taken in conjunction with the accompanying drawings.

BRIEF DESCRIPTION OF THE DRAWINGS

FIGS. 2, 2A, 2B, 3, 3A, 3B, 4 illustrate the operation of the preferred embodiment of FIG. 1 for some specific examples of conversion of a number in one base to an equivalent number in another base.

FIG. 9 illustrates typical addresses which may be employed for the counters in the embodiments of FIGS. 5 and 6 during an exemplary conversion.

FIGS 10, 10A, 10B illustrates the operation of the embodiment of FIG. 5 during an exemplary conversion.

DETAILED DESCRIPTION

Figure 1:
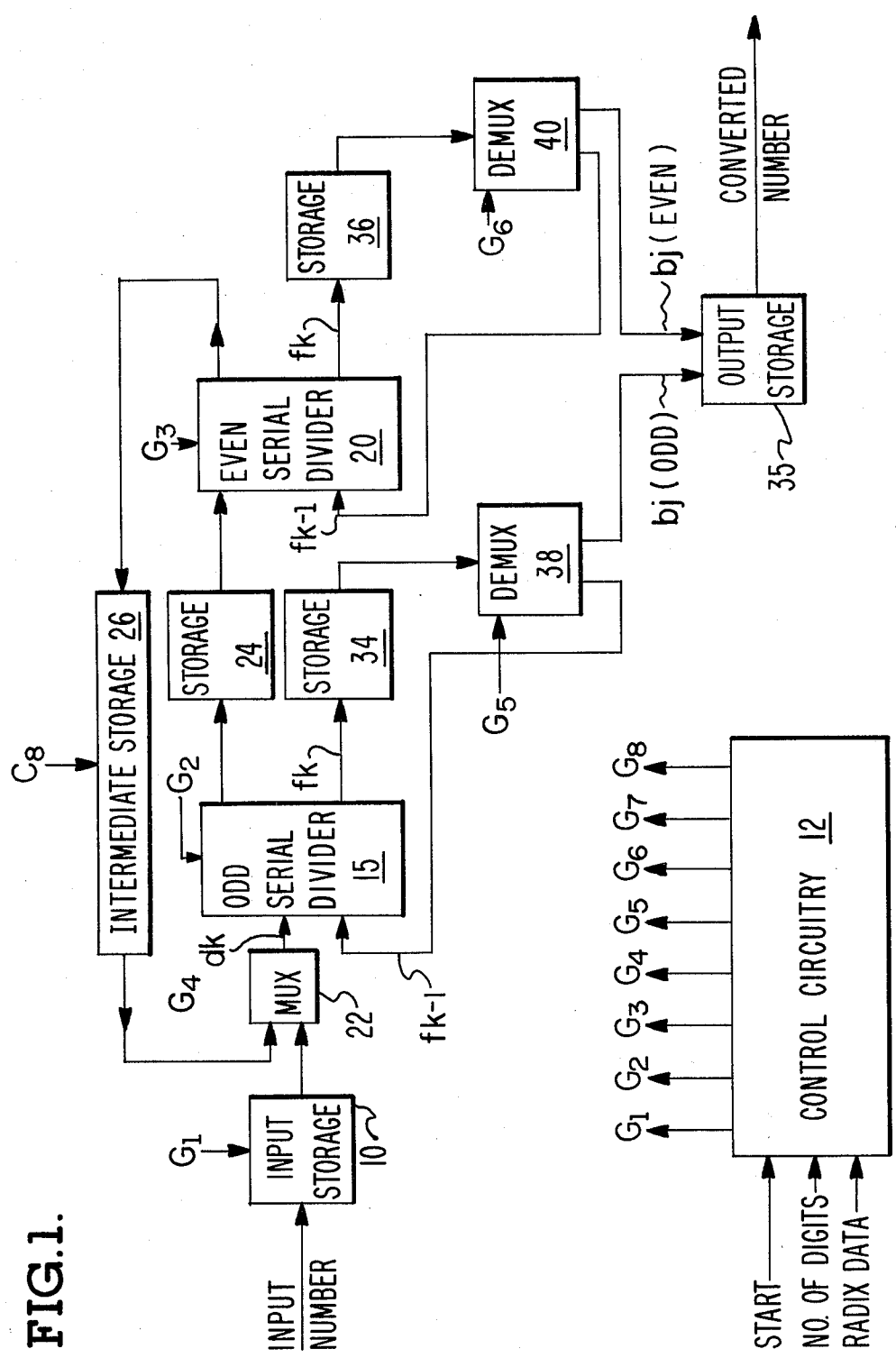
FIG. 1 is a block diagram of a preferred embodiment of the invention.

Like designations refer to like elements throughout the figures of the drawings.

Before proceeding to a description of preferred embodiments of the invention, the particular conversion approach employed will first be considered. As is well known, one way of converting a number in a first system of base or radix $r_1$ to a number in a second system of base or radix $r_2$ is to use the following divide-by-radix iterative equation:

$$\frac{Q_{j-1}}{r_2} = Q_j + b_j \tag{1}$$

where $j = 1, 2, \ldots n$, where $Q_0$ is the number N in the system of radix $r_1$ which is to be converted to a number M in the system of radix $r_2$, where $r_2$ is radix $r_2$ expressed in the system of $r_1$, where $Q_j$ is the quotient of the jth iteration, where n is the number for which the quotient $Q_j = 0$, where $b_j$ is the remainder of the jth division and is also the converted digit in radix $r_2$; and where the converted number M in radix $r_2$ is formed by assembling the $b_j$ remainders for $j = 1, 2, \ldots n$, that is, $M = b_n \ldots b_2, b_1$.

For example, the operation of the above equation (1) will be demonstrated for conversion of the decimal number 473 (radix 10) into its equivalent binary number 111011001 (radix 2). For this conversion, the values of $Q_0$ and $r_2$ in equation (1) are: $Q_0 = 473$, and $r_2 = 2$. The operation of equation (1) for this conversion thus proceeds as set forth in the following Table 1:

TABLE 1

| j | $Q_{j-1}$ | | $Q_{j-1}/r_2 = Q_j$ | | $b_j$ |
|---|---|---|---|---|---|
| 1 | $Q_0 =$ | 473 | 473/2 = | 236 | $b_1 = 1$ |
| 2 | $Q_1 =$ | 236 | 236/2 = | 118 | $b_2 = 0$ |
| 3 | $Q_2 =$ | 118 | 118/2 = | 59 | $b_3 = 0$ |
| 4 | $Q_3 =$ | 59 | 59/2 = | 29 | $b_4 = 1$ |
| 5 | $Q_4 =$ | 29 | 29/2 = | 14 | $b_5 = 1$ |
| 6 | $Q_5 =$ | 14 | 14/2 = | 7 | $b_6 = 0$ |
| 7 | $Q_6 =$ | 7 | 7/2 = | 3 | $b_7 = 1$ |
| 8 | $Q_7 =$ | 3 | 3/2 = | 1 | $b_8 = 1$ |
| 9 | $Q_8 =$ | 1 | ½ = | 0 | $b_9 = 1$ |

The equivalent binary number M of the decimal number 473 is thus:

$$M = b_9, b_8, b_7, b_6, b_5, b_4, b_3, b_2 b_1 = 111011001 \tag{2}$$

Having demonstrated how the radix conversion equation (1) is able to convert a number in a first radix into an equivalent number in a second radix, it will next be described how this basic conversion approach is employed in accordance with the invention in a manner which takes particular advantage of serial division so as to obtain a highly advantageous implementation for providing radix conversion. More specifically, in a preferred implementation of the present invention, advantage is taken of the characteristics of serial division to perform the successive divisions required by equation (1) in a manner which makes it possible to significantly reduce the conversion time as well as the conversion circuitry which would otherwise be required. An example of serial division is the procedure normally followed by a human in performing division by operating on one dividend digit at a time, beginning with the most significant dividend digit. For each dividend digit $d_k$, the corresponding quotient digit $g_k$ is obtained by determining the highest digit which when multiplied by the divisor v does not exceed the intermediate number $i_k$ obtained by the sum of the dividend digit and the product of the radix r with the digit remainder $f_{k-1}$ obtained from operations on the previous dividend digit $d_{k-1}$. The digit remainder $f_k$ is then the difference between this intermediate number $i_k$ and the product of the divisor v and the quotient digit $q_k$. The intermediate digit $i_k$, the quotient digit $g_k$, and the digit remainder $f_k$ may be expressed mathematically as follows:

Intermediate Number $i_k = rf_{k-1} + d_k$ (3)

Quotient Digit $g_k = i_k/v$ (4)

Digit Remainder $f_k = i_k - vg_k$ (5)

where $d_k$ is the kth dividend digit, where k=1, 2, ... m and m is the number of dividend digits.

It will be understood that the serial division equations (3), (4) and (5) above may be applied to each of the radix conversion divisions required in accordance with equation (1), in which case r in equation (3) is equal to the original radix r and the divisor v in equations (4) and (5) is equal to radix $r_2$. Equations (3), (4) and (5) thus become:

Intermediate Number $i_k = r_1 f_{k-1} + d_k$ (6)

Quotient Digit $q_k = i_k/r_2$ (7)

Remainder Digit $f_k = i_k - r_2 q_k$ (8)

where k=1, 2, ... m, and m is the number of dividend digits.

As an example of the use of equations (6), (7) and (8), Table 2 below illustrates how these equations are applied to the initial division 473/2 of Table 1, for which radix $r_1 = 10$, radix $r_2 = 2$ and m=3.

TABLE 2

| k | Dividend Digit $d_k$ | Intermediate No. $i_k = 10 f_{k-1} + d_k$ | Quotient Digit $q_k = i_k/2$ | Digit Remainder $f_k = i_k - 2q_k$ |
|---|---|---|---|---|
| 1 | $d_1 = 4$ | $i_1 = 10 \times 0 + 4 = 4$ | $q_1 = 4/2 = 2$ | $f_1 = 4 - 2 \times 2 = 0$ |
| 2 | $d_2 = 7$ | $i_2 = 10 \times 0 + 7 = 7$ | $q_2 = 7/2 = 3$ | $f_2 = 7 - 2 \times 3 = 1$ |
| 3 | $d_3 = 3$ | $i_3 = 10 \times 1 + 3 = 13$ | $q_3 = 13/2 = 6$ | $f_3 = 13 - 2 \times 6 = 1$ |

In conformance with Table 1, the resulting quotient $Q_1$ and quotient remainder $b_1$ for the first division 473/2 of Table 1 is thus:
$Q_1 = q_1 q_2 q_3 = 236$ and
$b_1 = f_m = f_3 = 1$ It will be understood from equations (6), (7) and (8) and Table 2 above that each quotient digit $q_k$ and its digit remainder $f_k$ are derived in basically the same way. This makes it possible to time share common circuitry for serially deriving the quotient digits and the digit remainders. As will hereinafter become evident, the preferred implementation takes advantage of this time-sharing capability to achieve circuit economy.

It will also be understood from equations (6), (7) and (8) and Table 2 that serial division is performed beginning with the most significant dividend digit, and that the quotient digits are also derived beginning with the most significant quotient digit. This makes it possible in performing the successive divisions required by equation (1) to provide for initiation of a next required division as soon as the first quotient digit of a division currently being performed is derived. As will hereinafter become evident, the preferred implementation takes advantage of this characteristic to reduce the overall time required for radix conversion.

For the particular cases of conversion from decimal to binary, or vice versa, the preferred implementation is also able to take advantage of the fact that a binary coded hexadecimal number (radix 16) directly corresponds to its equivalent binary number without any conversion being required. For reference, the relationships between decimal, hexadecimal and binary for hexadecimal numbers 0 to 10 are given in the table below:

TABLE 3

| Decimal | Hexadecimal | Binary |
|---|---|---|
| 0 | 0 | 0000 |
| 1 | 1 | 0001 |
| 2 | 2 | 0010 |
| 3 | 3 | 0011 |
| 4 | 4 | 0100 |
| 5 | 5 | 0101 |
| 6 | 6 | 0110 |
| 7 | 7 | 0111 |
| 8 | 8 | 1000 |
| 9 | 9 | 1001 |
| 10 | A | 1010 |
| 11 | B | 1011 |
| 12 | C | 1100 |
| 13 | D | 1101 |
| 14 | E | 1110 |
| 15 | F | 1111 |
| 16 | 10 | 10000 |

As an example of the direct convertibility from binary coded hexadecimal to binary, it will be understood that the decimal number 473 corresponds to the hexadecimal number 1D9. In binary coded hexadecimal 1D9 is represented as 0001 1101 1001 which identically corresponds to the equivalent binary number 000111011001. The present invention takes advantage of this direct convertibility between binary coded hexadecimal and binary to reduce the number of iterative divisions required by equation (1) for decimal to binary conversion (such as illustrated in Table 1), or vice versa, thereby reducing the number of serial operations required to be performed in accordance with equations (6), (7) and (8). For example, this is accomplished for decimal to binary conversion in the preferred implementation by using equations (6), (7) and (8) with $r_1 = 10$ and $r_2 = 16$ for converting a decimal number to binary coded hexadecimal rather than to binary, in which case the binary coded hexadecimal bits will directly correspond to the binary number. Thus, much fewer iterative divisions are required in accordance with equation (1) as illustrated below for conversion of the decimal number 473 to the hexadecimal number 1D9 (compare with Table 1):

TABLE 4

| j | $Q_{j-1}$ | $Q_{j-1}/16 = Q_j$ | $b_j$ (hexadecimal) |
|---|---|---|---|
| 1 | $Q_0 = 473$ | $473/16 = 29$ | $b_1 = 9$ |
| 2 | $Q_1 = 29$ | $29/16 = 1$ | $b_2 = D$ |

TABLE 4-continued

| j | $Q_{j-1}$ | $Q_{j-1}/16 = Q_j$ | $b_j$ (hexadecimal) |
|---|---|---|---|
| 3 | $Q_2 = 1$ | $1/16 = 0$ | $b_3 = 1$ |

The equivalent hexadecimal number H of the decimal number 473 is thus:

$H = b_3 b_2 b_2 = 1D9$

As a further example, Table 5 below illustrates the use of the serial division equations (6), (7) and (8) for performing the initial division 473/16 of the hexadecimal to decimal conversion illustrated in Table 4 for which $r_1 = 10$ and radix $r_2 = 16$.

TABLE 5

| k | Dividend Digit $d_k$ | Intermediate No. $i_k = 10f_{k-1} + d_k$ | Quotient Digit $q_k = i_k/16$ | Digit Remainder $F_k = i_k = 16q_k$ |
|---|---|---|---|---|
| 1 | $d_1 = 4$ | $i_1 = 10 \times 0 + 4 = 4$ | $q_1 = 4/16 = 0$ | $f_1 = 4 - 16 \times 0 = 4$ |
| 2 | $d_2 = 7$ | $i_2 = 10 \times 4 + 7 = 47$ | $q_2 = 47/16 = 2$ | $f_2 = 47 - 16 \times 2 = 15 = F$ |
| 3 | $d_3 = 3$ | $i_3 = 10 \times 15 + 3 = 153$ | $q_3 = 153/16 = 9$ | $f_3 = 153 - 16 \times 9 = 9$ |

In conformance with Table 4, the resulting quotient $Q_1$ and quotient remainder $b_1$ for the first division 473/16 of Table 4 is thus:

$Q_1 = q_1 q_2 q_3 = 029$ and
$b_1 = f_m = f_3 = 9$

It will be understood that for binary to decimal conversion, advantage may also be taken of the direct convertibility between binary and binary coded hexadecimal by considering the binary number as being arranged in 4-bit groups corresponding to binary coded hexadecimal. A hexadecimal to decimal conversion is then performed using equations (6), (7) and (8) with $r_1 = 16$ and $r_2 = 10$, again significantly reducing the iterative divisions required in accordance with equation (1).

Having described the basic approach employed by the present invention for radix conversion using the iterative conversion equation (1) and the serial division equations (6), (7) and (8), a preferred implementation will now be considered with reference to FIG. 1. As shown, the input digits of a number N to be converted are initially stored in an input storage 10. Data indicating the number of digits of N, the radix conversion desired, and a start signal are provided to control circuitry 12 which controls overall operation including the accessing of N digits from the input storage 10 in response to control signal $G_1$. If a binary to decimal conversion is to be performed using a hexadecimal to decimal conversion, the accessing of input storage 10 will be controlled so that the input binary bits are serially outputted in groups of four corresponding to binary coded hexadecimal.

The preferred implementation of FIG. 1 provides for performing the divisions required by equation (1) and equations (6), (7) and (8) using two serial dividers, an odd serial divider 15 and an even serial divider 20 controlled by signals $G_2$ and $G_3$, respectively, from control circuitry 12. The odd serial divider 15 serves to perform the odd divisions required by equation (1), while the even serial divider serves to perform the even divisions required by equation (1). For example, with reference to the conversion illustrated in Table 1, the odd serial divider 15 would perform odd divisions for which $j = 1$, 3, 5, 7 and 9 and thereby produce the odd quotients $Q_1$, $Q_3$, $Q_5$, $Q_7$ and $Q_9$ and odd digits $b_1$, $b_3$, $b_5$, $b_7$ and $b_9$ of the converted number, while the even serial divider 20 would perform the even divisions for which $j = 2, 4, 6$ and 8 in Table 1 and thereby produce the even quotients $Q_2$, $Q_4$, $Q_6$ and $Q_8$ and the even digits $b_2$, $b_4$, $b_6$ and $b_8$ of the converted number.

Each division performed by serial divider 15 or 20 in FIG. 1 is performed by serial division in accordance with equations (6), (7) and (8) as illustrated, for example, in Table 2 for the $j = 1$ division 473/2 of Table 1. In other words, as indicated in FIG. 1, each serial divider 15 or 20 receives input signals representing appropriate $d_k$ and $f_{k-1}$ values and, in accordance with equations (6), (7) and (8), produces output signals representing $q_k$ and $f_k$ values, the particular radix conversion being determined by the respective control signals $G_2$ and $G_3$ which are in turn dependent on the input radix conversion data provided to the control circuitry 12. It is assumed for the preferred implementation of FIG. 1 that appropriate clocking is provided in a conventional manner and that each operation of the serial dividers 15 and 20 and the various stages provided occur in a single clock period. Each of serial dividers 15 and 20 may typically be a PROM which is programmed so as to be responsive to the $d_k$ and $f_{k-1}$ inputs applied thereto to produce $q_k$ and $f_k$ outputs in accordance with equations (6), (7) and (8).

As pointed out previously, each serial division in accordance with equations (6), (7) and (8) is performed beginning with the most significant dividend digit, the quotient digits likewise being produced beginning with the most significant quotient digit. The use of the two serial dividers 15 and 20 permits advantage to be taken of this characteristic by permitting the even serial divider 20 to begin the next required division in accordance with equation (1) as soon as the first quotient digit of the previous division produced by the odd serial divider 15 is made available. This is accomplished as illustrated in FIG. 1 by feeding each quotient digit $q_k$ produced by the odd serial divisor 15 to the $d_k$ input of the even serial divider 20 via storage 24, whereby each odd quotient digit is made available for use by the even serial divider 20 in the next clock period.

As also shown in FIG. 1, each even quotient digit produced by the even serial divisor 20 is fed back to the $d_k$ input of the odd serial decoder 15 via intermediate storage 26 and multiplexer 22. The multiplexer 22 operates in response to control signal $G_4$ to initially serially feed the digits of the input number from input storage 10 to the $d_k$ input of the odd serial divider 15 for use in performing the first division required by equation (1). After completion of this first division on the input number, the control signal $G_4$ then causes multiplexer 22 to serially feed even quotient digits from the intermediate storage 26 to the $d_k$ input of the odd serial divider 15. In this regard, it is to be noted that, as the number of digits in the number to be converted becomes larger, it takes correspondingly more clock periods (one clock period per digit in the preferred implementation) for a serial divider to generate all of the quotient digits required for a division. Thus, with regard to the preferred implementation of FIG. 1, it will be understood that if an input number has greater than two digits, the odd serial divider 15 will still be busy performing a previous division when an even quotient digit is in storage 26 and ready to be used for performing the next odd division. In such a case, this next odd division will have to wait until the odd serial divider 15 has completed its current serial division and is thus free to perform its next division. This delay can be reduced by providing additional serial dividers in the implementation of FIG. 1. The fastest conversion will, of course, be obtained when there are enough serial dividers so that, for the maximum size input number, there will always be a free serial divider available to begin a next required serial division as soon as a first quotient digit of the previous serial division is available for use. For the preferred implementation of FIG. 1, this would be achieved when the number of serial dividers provided is equal to the maximum number of digits to be expected in the input number. Thus, although FIG. 1 illustrates only two serial dividers 15 and 20, it is to be understood that additional ones may be provided. Also, in the event that economy of circuitry is more important than conversion time, a single serial divider could be used in the implementation of FIG. 1.

Still with reference to FIG. 1, it will now be explained how the $f_{k-1}$ values are provided to each of the serial divisors 15 and 20 for use in performing serial division in accordance with equations (6), (7) and (8). It will be seen that the digit remainder output $f_k$ of each serial divider 15 or 20 is applied to a respective storage 34 or 36 whose output is in turn applied to a respective demultiplexer 38 or 40 controlled by a respective control signal $G_5$ or $G_6$ from control circuitry 12. For every dividend digit, except the last one, each of control signals $G_4$ and $G_5$ causes its respective demodulator 38 or 40 to feed the outputs of the respective storage 34 or 36 back to the $f_{k-1}$ input of its respective serial divider 15 or 20, thereby providing the $f_{k-1}$ input value required for each serial divider for use with each input dividend digit $d_k$ in accordance with equations (6), (7) and (8).

However, for the last dividend digit, each of control signals $G_4$ and $G_5$ causes the output of its respective storage 34 or 36 to be fed to an output storage 35 instead of to the $f_{k-1}$ input of its respective serial divider. This is proper since, as illustrated, for example, in Tables 2 and 5, the $f_k$ values produced for the last dividend digit of a serial division performed in accordance with equations (6), (7) and (8) is the remainder $b_j$ of a particular one of the divisions required in accordance with equation (1), and is thus also a digit of the converted number (see, for example, Table 1). As indicated in FIG. 1, the demultiplexer 38 selects for storage in output storage 35 the odd $b_j$ digits produced by the odd serial divider 15, while the demultiplexer 40 selects for storage in output storage 35 the even $b_j$ digits produced by the odd serial divider 20. These $b_j$ digits may be outputted from output storage 35 at an appropriate time in response to control signal $G_7$. It will be understood that, if a decimal to hexadecimal conversion is being performed for which the converted binary coded hexadecimal number is intended to be used in true binary form, control signal $G_7$ would then provide for outputting the $b_j$ digits in a manner corresponding thereto, as described previously.

Figures 2B, 3B:
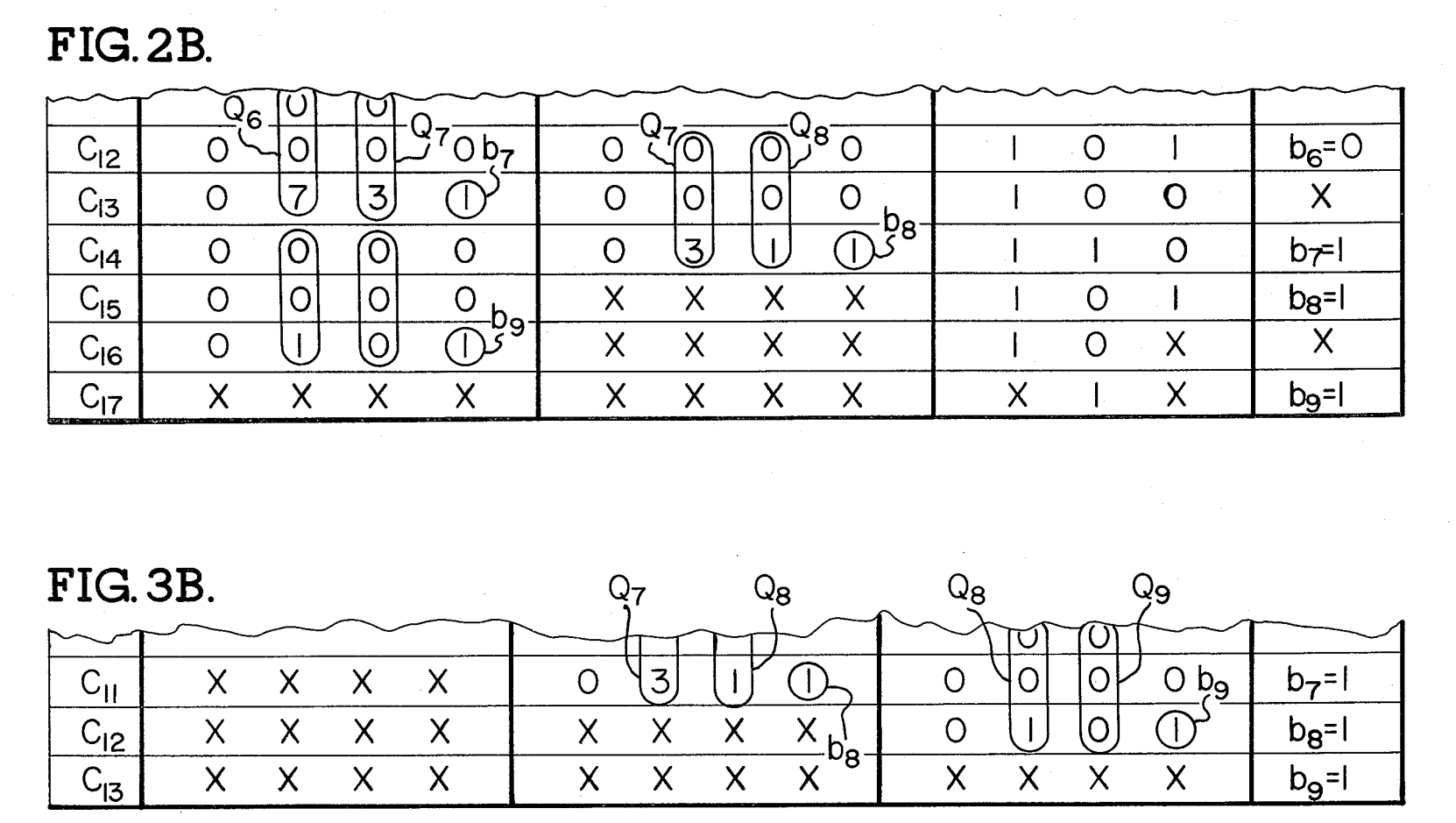

The construction, arrangement and operation of the preferred implementation of FIG. 1 will become readily evident by considering the following operation examples illustrated in FIGS. 2, 3 and 4.

FIG. 2 illustrates the operation of FIG. 1 in converting the decimal number 473 into the equivalent binary number 111011001 by employing serial division in accordance with equations (6), (7) and (8) for performing the iterative divisions required by equation (1). It will be noted that Table 1 illustrates the particular nine divisions required for converting the decimal number 473 into the equivalent binary number 111011001, and that Table 2 illustrates the use of serial division in accordance with equations (6), (7) and (8) for performing the first division 473/2 required by Table 1. Accordingly, it will be helpful to refer to Tables 1 and 2 as well as to FIG. 1 in order to more readily understand the following description of FIG. 2. Note that the $f_{k-1}$, $d_k$, $q_k$, $f_k$, $b_j$ and $Q_k$ parameters in FIG. 2 correspond to those in Tables 1 and 2, and that columns $G_4$, $G_5$ and $G_6$ correspond to like designated control signals in FIG. 1.

Clock Period $C_1$

The first clock period $C_1$ in FIG. 2 represents an initial clock period during which the control circuitry 12 in FIG. 1, using control signal $G_1$, provides for storing the input number to be converted into input storage 10. Control circuitry 12 also responds to the various inputs applied thereto for performing various initial functions (such as clearing, presetting, etc.) in preparation for the particular conversion to be performed on the input number. Of course, additional clock periods could be provided for such purposes if necessary. The "X" lines in FIG. 2 indicate that the control provided by control circuitry 12 during the applicable clock period is such that the values of their respective parameters are not used or effective during that clock period and may thus be considered as "no care" values. For example, during the initial clock period $C_1$, the operation of the serial dividers 15 and 20, the multiplexer 22 and the demodulators 38 and 40 may be inhibited by their respective control signals $G_2$, $G_3$, $G_4$, $G_5$ and $G_6$, in which case the various $f_{k-1}$, $d_k$, $q_k$, $f_{k-1}$, and $b_j$ values during clock period $C_1$ are of no concern.

Clock Period $C_2$

As indicated in FIG. 2, conversion begins during clock period $C_2$ when the first dividend digit "4" of the input number $Q_O=473$ is applied from the input storage 10 to the $d_k$ input of the odd serial divider 15 via the multiplexer 22—that is, $d_k=4$ for the serial divisor 15 during $C_2$. The $G_4=0$ condition illustrated for the $C_2$ clock period in FIG. 2 indicates that the multiplexer 22 is applying an input number digit from input storage 10 rather than a digit from the intermediate storage 26.

Also during clock period $C_2$, the odd serial divider 15 responds to the $d_k=4$ and $f_{k-1}=0$ input values applied thereto ($f_{k-1}$ being zero as a result of storage 34 being set to 0 during initial clock period $C_1$) to produce as outputs the first quotient digit $q_k=2$ of quotient $Q_1$ and the first remainder digit $f_k=0$ in conformance with equations (6), (7) and (8), and as specifically illustrated by the initial $k=1$ operation in Table 2. These $q_k=2$ and $f_k=0$ values produced by serial divider 15 during $C_2$ are stored in respective storages 24 and 34 in FIG. 1. Note that the even serial divider 20 is not brought into operation during clock period $C_2$ since the $q_k$ and $f_k$ values produced by the odd serial divider 15 will not be available at the outputs of storages 24 and 34 until the next clock period $C_3$.

Clock Period C$_3$

During clock period C$_3$, the d$_k$ input of the odd serial divider 15 now receives (via multiplexer 22) the second dividend digit "7" of the input number 473 stored in input storage 10. Also during C$_3$, the first quotient digit "2" produced by serial divider 15 during C$_2$ is now present at the output of the storage 24 and is applied as the d$_k$ input of the even serial divisor 20—that is, d$_k$=2 for serial divider 20 during C$_3$. The f$_{k-1}$ value for the odd serial divider 15 during C$_3$ is the output of the storage 34 which is applied to the f$_{k-1}$ input of the serial divider 15 via demultiplexer 38. It will be understood that the storage 34 will provide an output of f$_{k-1}$=0 during C$_3$, since the odd serial divisor 15 provided an f$_k$=0 output thereto during C$_2$. The storage 36 will also provide an output of f$_{k-1}$=0, since it remained at zero during C$_2$ as a result of the even serial divider 20 being inhibited during C$_2$ as indicated by the "X" lines in FIG. 2. The G$_5$=0 and G$_6$=0 conditions shown for C$_3$ in the G$_5$ and G$_6$ columns of FIG. 2 indicate that G$_5$ and G$_6$ cause their respective demultiplexer 38 or 40 to feed the output of its respective storage 36 or 40 to the f$_{k-1}$ input of its respective serial divider 15 or 20, rather than to the output storage 35.

It will be understood from equations (6), (7) and (8) and Tables 1 and 2 that, as a result of the f$_{k-1}$=0 and the d$_k$=3 inputs being applied to the odd serial divider 15 during C$_3$, the odd serial divider 15 produces an output q$_k$=3 (which is the second quotient digit of Q$_1$) along with an output of f$_k$=1 (which is the corresponding digit remainder). Also, as a result of the f$_{k-1}$=0 and the d$_k$=2 inputs being applied to the even serial divider 20 during C$_3$, the even serial divider produces an output q$_k$=1, which is the first quotient digit of the quotient Q$_2$=118 along with an output f$_k$=0 which is the corresonding digit remainder. As shown in FIG. 2, this q$_k$=1 output of the even serial divider 20 is applied to the intermediate storage 26.

Clock Period C$_4$

During clock period C$_4$ in FIG. 2, the third and last digit "3" of the input number Q$_0$=473 is applied to the q$_k$ input of the odd serial divider 15, while the second digit "3" of the quotient Q$_1$=236 is applied to the q$_k$ input of the even serial divider 20. Also during C$_4$, the appropriate f$_{k-1}$=1 digit remainder value is applied to the f$_{k-1}$ input of the odd serial divider 15 and the appropriate f$_{k-1}$=0 value is applied to the f$_{k-1}$ input of the even serial divider 20.

In the same basic manner as described for clock period C$_3$, during clock period C$_4$ the odd serial divider 15 produces the third quotient digit q$_k$=6 of the quotient Q$_1$=236 along with a corresponding digit remainder f$_k$=1, and the even serial divider 20 produces the second quotient digit q$_k$=1 of the quotient Q$_2$=118 along with a corresponding digit remainder f$_k$=1. It will be understood from equations (6), (7) and (8) and Tables 1 and 2 that, since q$_k$=6 is the last quotient digit of the quotient Q$_1$ produced by the odd serial divider 15 in response to the input decimal number Q$_0$=473, the corresponding digit remainder f$_k$=1 produced during C$_4$ is the first or least significant converted digit b$_1$=1 as indicated in FIG. 2.

It will be noted that, although the first quotient digit q$_k$=1 of the quotient Q$_2$=118 was produced and stored in the intermediate storage 26 during the previous clock period C$_3$, it is not used during C$_4$ for producing the first quotient digit of the next quotient Q$_3$, since the odd serial divider 15 is busy during C$_4$ with the last digit "3" of the input number. Accordingly, the beginning of operations on the first quotient digit q$_k$=1 of the quotient Q$_2$=118 for producing the next quotient digit Q$_3$=059 has to wait until the next clock period C$_5$ when the odd serial divider 15 will have completed operations on the input number Q$_0$=473. The intermediate storage 26 is provided with sufficient storage to accommodate this waiting time.

Clock Period C$_5$

In order to permit the least significant converted digit b$_i$=1 produced by the odd serial divider 15 during C$_4$ to be fed to the output storage 35, the control signal G$_5$ applied to the odd demultiplexer is a "1" during C$_5$ so as to cause this b$_1$=1 converted digit to be applied to the output storage 35 during C$_5$ instead of to the f$_{k-1}$ input of the odd serial divider 15 which thus receives a f$_{k-1}$=0 value. While this first or least significant converted digit b$_1$=1 is being applied to the output storage 35 during C$_5$, the odd serial divider 15 is now able to begin operations on the first digit g$_k$=1 of the quotient Q$_2$=118. This first digit q$_k$=1 of the quotient Q$_2$=118 is accordingly applied during C$_5$ from the intermediate storage 26 (in response to control signal C$_8$) to the d$_k$ input of the odd serial divider 15 via the multiplexer 22. Note that the control signal G$_4$ (see FIG. 2) is "1" during C$_5$ so that the multiplexer 22 will provide for the input q$_k$ digit to be obtained from the intermediate storage 26 during C$_5$ rather than from the input storage 10, as occurred during clock periods C$_2$, C$_3$ and C$_4$. The f$_{k-1}$ value applied to the odd serial divider is f$_{k-1}$=0 during C$_5$ (as it is at the beginning of each new division) as a result of the control signal G$_5$ of the odd demultiplexer 38 applying the digit remainder b$_1$=1 produced by the odd serial divider 15 during the previous clock period C$_4$ to the output storage 35.

Also during clock period C$_5$, the even serial divider 20 receives a d$_k$ input of d$_k$=6 (which is the third and last digit of the quotient Q$_1$=236) along with an f$_{k-1}$ input of f$_{k-1}$=1. As a result, the even signal divider 20 produces a q$_k$=8 output corresponding which is the third digit of the quotient Q$_2$=118 and an f$_{k-1}$=0 output which is the second or next least significant converted digit b$_2$=0, since it is the remainder occurring after operation on the last quotient digit "6" of the quotient Q$_1$.

Clock Periods C$_6$-C$_{17}$

During clock period C$_6$, the control signal G$_6$ of the even demultiplexer 40 in FIG. 2 is "1" to permit the second converted digit b$_2$=0 produced by the even serial divider 20 during C$_5$ to be applied to the output storage 35 in the same manner as was provided for the least significant converted digit b$_1$ during C$_5$ when the odd demultiplexer control signal G$_5$ had a value of "1".

Having explained how the first two least significant converted digits b$_1$=1 and b$_2$=0 of the conversion of the decimal number 473 to the binary number 11101101 are produced, it should now be evident from the foregoing description along with equations (1), (6), (7) and (8) and Tables 1 and 2 how operations proceed during clock periods C$_6$-C$_{17}$ in FIG. 2 so as to produce the remaining converted binary digits b$_3$ through b$_9$. It will also be understood from the foregoing description that the one clock delays shown in FIG. 2 as occurring between the production of converted digits $b_2$ and $b_3$, $b_4$ and $b_5$, $b_6$ and $b_7$, and $b_8$ and $b_9$ are a result of the odd serial divider 15 still being busy with a previous division even though the first quotient of the next division has already been produced by the even serial divider 20 and stored in the intermediate storage 26.

FIG. 3 illustrates the same conversion of the decimal number 473 to the binary number 111011001 as illustrated in FIG. 2, except that three serial dividers are used in the example of FIG. 3 instead of the two serial dividers 15 and 20 employed for the example of FIG. 2. Values of the control signals $G_4$, $G_5$ and $G_6$ are omitted from FIG. 2, since their values will be obvious from the previous description of the example of FIG. 2. It will be evident from FIG. 3 that the use of the three serial dividers avoids the delay experienced in the two serial divider example of FIG. 2 between the production of certain converted digits, since the use of a third serial divider for converting a three digit decimal number to binary always provides an available serial divisor for beginning a next required division as soon as the first quotient digit of the previous division is available. Thus, the three serial divider example respresented by FIG. 3 is four clock periods shorter than FIG. 2. Of course, if the input number to be converted has more than three digits, the number of serial dividers that would have to be provided to avoid delay would have to be increased accordingly. It will be understood that whether or not additional serial dividers are provided in a given application will depend upon the relative importance of speed and economy.

FIG. 4 illustrates the conversion of the decimal number 473 to the binary number 11101101 where advantage is taken of the direct convertibility between binary coded hexadecimal and binary, as described previously herein. More specifically, FIG. 4 illustrates the conversion of the decimal number 473 to the hexadecimal number 1D9. In binary coded decimal form 1D9 is 000111011001 which directly corresponds to the equivalent binary number 111011001 and may accordingly be accessed in true binary form from the output storage 35 in FIG. 1 under the control of control signal $G_7$. The procedure and operation of the preferred implementation of FIG. 1 for the example of FIG. 4 is basically the same as described in connection with FIG. 2 except that $r_2 = 16$ in equations (6), (7) and (8). Thus, the procedures and operations required for FIG. 4 will be readily evident, particularly when considered along with Table 4 which specifically illustrates the use of equation (1) in the conversion of the decimal number 473 to the hexadecimal number 1D9, and along with Table 5 which illustrates the use of the serial division equations (6), (7) and (8) in performing the first division 473/16 required by Table 1.

Figure 5:
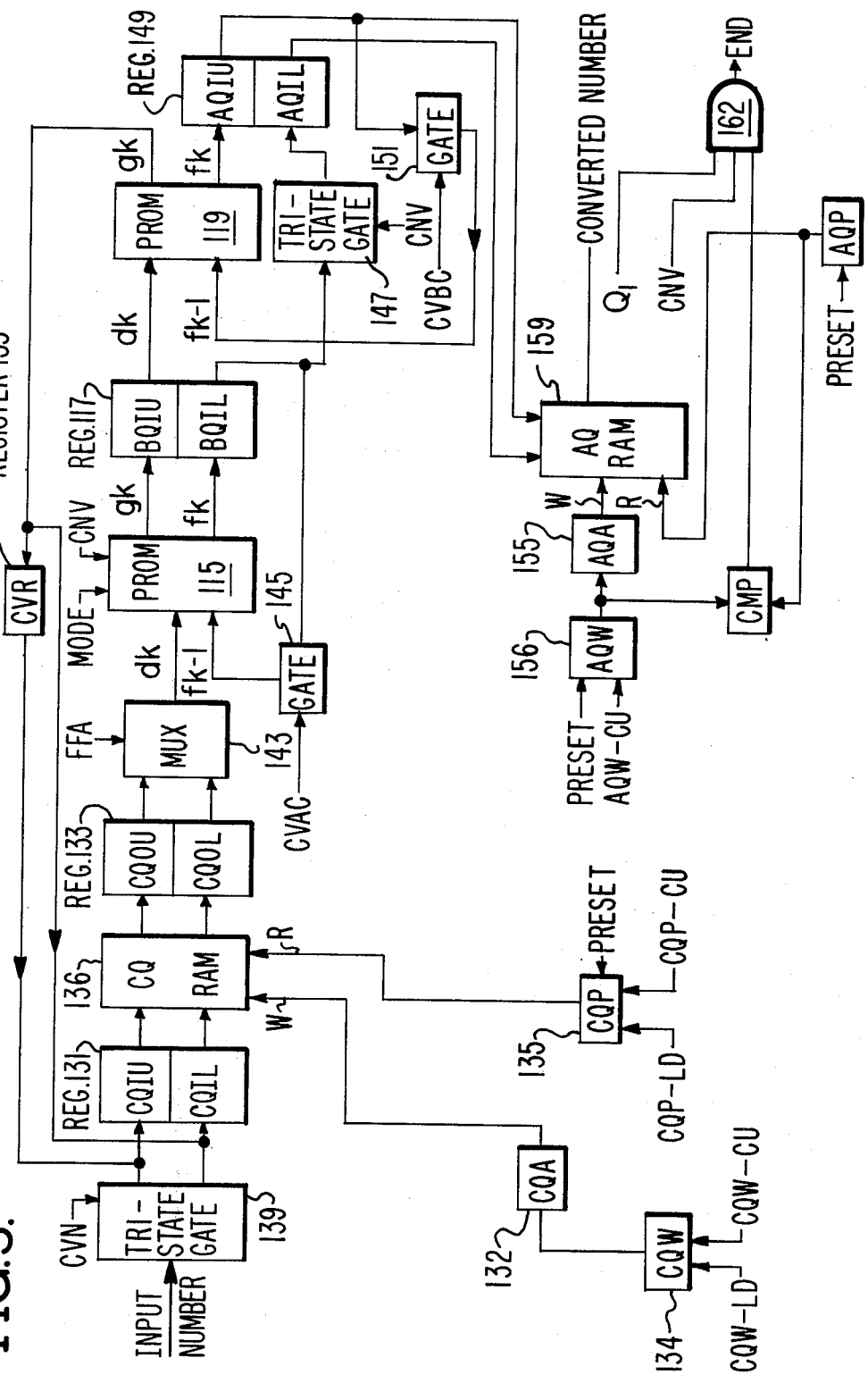
FIG. 5 is a block diagram of a more detailed embodiment in accordance with the invention.

A more detailed exemplary implementation in accordance with the invention which also is able to take advantage of the direct convertibility between a binary coded hexadecimal number and a binary number will next be considered with reference to FIGS. 5-10. FIG. 5 discloses a schematic block diagram of this detailed exemplary implementation. For purposes of this particular description, the input number to be converted will be assumed to be a BCD number having four BCD digits which are grouped into two characters, each character comprising two BCD digits.

Referring to FIG. 5, the two BCD digits in each character of the input number to be converted are parallel-fed from an input bus through a conventional tri-state gate 139 (enabled by a $\overline{CNV}$ signal) into CQIU and CQIL portions, respectively, of a register 131, and then are selectively written into predetermined address locations of the ACQ RAM 136 prior to the conversion operation. The gate 139 remains enabled by the $\overline{CVN}$ signal before the conversion operations begin. A clock generator 129 supplies phase one ($\phi1$) and phase two ($\phi2$) clocks, having the same frequency but phase-displaced from each other, for use in the operation of the apparatus of FIG. 5 in a conventional manner.

Before the input number to be converted is stored in the RAM 136, counters CQW 134 and CQP 135 are each preset to a home position which may be represented in hexadecimal notation as FF. This home position FF in CQW counter 134 is clocked into a CQA register 132 on the next $\phi2$ clock. It is the output of the CQA register 132 which is used as the write address for the RAM 136. The first two-digit character of the input number is stored in the FF address. Each time that a character is written into the RAM 136, a CQW counter 134 is incremented by one, which in turn causes the CQA register 132 to change its address by one. For example, for a two character input number, the two characters of that number would be respectively written into RAM 136 address locations FF and 00. To avoid destroying the information in address location 00, the counter CQW 134 would be incremented by one to cause the CQA register 132 to store a write address of 01. As a consequence, the number of count positions of the CQW counter 134 from its home position FF would indicate the number of characters in the input number that is stored in RAM 136. For example, if CQW counter 134, and hence CQA register 132, had an address count of 01 just prior to a conversion operation, the input number would be two characters in length. This is due to the fact that the count position of the CQW counter 134 would be two positions away from its home position FF.

The reception of a "start CNV" signal (to be explained later with reference to FIG. 6) starts the conversion operation, causing write addresses developed by a CQP counter 135, as a function of the binary states of CQP-load (CQP-LD) and CQP-countup (CQP-CU) signals, enable the RAM 136 to sequentially read out the characters stored in the addressed locations.

Each character from the RAM 136 is clocked into a register 133, with the more significant BCD digit being stored in a CQOU portion of register 133 and the less significant BCD digit being stored in a CQOL portion of register 133. The two BCD digits of each character in register 133 are selectively time multiplexed by a multiplexer 143 to provide a pair of consecutive $d_k$ inputs for a PROM 115 which serves as an odd serial divider operating in accordance with equations (6), (7) and (8) to produce $q_k$ and $f_k$ output digits as previously described. The multiplexer 143 is controlled by the binary state of an FFA signal. When FFA=0, the multiplexer 143 outputs the more significant BCD digit stored in CQOL. When FFA=1, the multiplexer 143 outputs the less significant BCD digit stored in CQOU.

At the same time that $d_k$ is being provided to PROM 115, an $f_{k-1}$ digit is provided to PROM 115 from the BQIL portion of a register 117 via a gate 145. The gate 145 is controlled by the binary state of a CVAC signal such that an $f_{k-1}$ digit stored in BQIL is passed through the gate 145 only when CVAC=1. When CVAC=0, the output of the gate 145=0. The output of the gate 145 is the $f_{k-1}$ digit that is applied to the PROM 115 along with the $d_k$ digit from BQIU during each clock period.

The CNV signal enables the PROM 115 in response to each pair of input $q_k$ and $f_{k-1}$ digits to produce output $q_k$ and $f_k$ digits which are stored in BQIU and BQIL respectively of register 117. The digit stored in BQIL is the $f_{k-1}$ digit which is applied to PROM 115 during the next clock period. The $f_{k-1}$ digit from the BQIL portion of register 117 is also applied to a tri-state gate 147 which when enabled by CNV passes the digit to an AQIL portion of a register 149.

The $q_k$ digit from BQIU in the register 117 is applied to a second PROM 119 which serves as an even serial divider. An associated $f_{k-1}$ digit for the PROM 119 is derived from a gate 151 which is controlled by the binary state of a CVBC signal. When CVBC=1, the output from the AQIU portion of the register 149 is passed through gate 151 as the $f_{k-1}$ digit for PROM 119. When CVBC=0, the gate 151 is closed and the $f_{k-1}$ digit for PROM 119 is then "0".

Like the PROM 115, the PROM 119 is enabled by the CNV signal to produce output digits $q_k$ and $f_k$ in accordance with equations (6), (7) and (8). Each $q_k$ digit produced by PROM 119 is concurrently applied to a CVR register 153 and also directly to the CQIL portion of register 131. The CVR register 153 delays each $q_k$ digit by one clock pulse period (for a two-character input number) before applying the $q_k$ digit through the enabled tri-state gate 141 to the CQIU portion of the register 131. The two paths provided for each $q_k$ digit, one delayed by the CVR register 153 and the other undelayed, enable each consecutive pair of $q_k$ digits from the PROM 119 to be combined into a character which is then clocked into the CQI register 137 for storage in the CQ RAM 136. The CQW-LD and CQW-CU signals selectively control the count of the up-down CQW counter 134, and hence the write addresses from the CQA register 132 to the RAM 136 so that this pair of $q_k$ digits are stored at an appropriate location in RAM 136 so as to be ready for use as consecutive input digits $d_k$ to PROM 15 after operations have been completed on the input number.

In addition to gates 147 and 151 and AQI register 149, the output portion of FIG. 5 also includes an AQA register 155, up-down counters AQW 156 and AQP 157, an AQ RAM 159, a comparator (CMP) 161 and an AND gate 162. The registers 149 and 155, counters 156 and 157 and RAM 159 are similar in structure and operation to the registers 131 and 132, counters 134 and 135 and RAM 136, respectively, and hence are not further description.

Before the conversion operation starts, the AQW counter 156 is preset to 00. This count is applied to the AQA register 155 on the next $\phi 2$ clock and is the initial write address for the RAM 159 at the start of the conversion operation. During the conversion operation, an AQW-count up (AQW-CU) signal selectively controls the count of the AQW counter 156, and hence the write address from the AQA register 155 to the RAM 159.

It will be recalled that after the input number to be converted is stored in RAM 136, the count of the CQW counter 134 from its home position FF indicated the number of characters in the input number. Similarly, the AQP counter 157 is preset to a predetermined number of positions from its home position FF. This predetermined number is a function of the type of number conversion to be performed and the number of positions that the CQW counter 134 had counted to from its home position in the storing of the input number in RAM 136. For example, if CQW counter 134 had counted from FF to 01, which indicated a two-character input number stored in the RAM 136, the AQP counter 157 would be preset from the home position FF to FD for a BCD-to-Binary conversion.

The comparator 161 compares the write address contained in the AQA register 155 with the read address of the preset AQP counter 157. When the two addresses become equal to each other, the comparator 161 develops and applies a 1-state signal to the lower input of AND gate 162. Applied to the upper two inputs of AND gate 162 are the $\phi 1$ clock and the CNV signal. Upon coincidence of the $\phi 1$ clock, the CNV signal and the 1-state output of the comparator 161, the AND gate develops a 1-state END pulse which causes the termination of the CNV signal one clock period later (to be explained).

In the operation of each of RAMs 136 and 159, respectively, a "write" cycle is followed by a "read" cycle. The $\phi 2$ clock is only used by the registers CQA 132 and AQA 155 to control the timing of the "write" cycle, while the $\phi 1$ clock is used by counters CQP 135 and AQP 157 to control the timing of the "read" cycle. In addition, the remaining components of FIG. 5 also use the $\phi 1$ clock.

Also applied to both of the PROMs 115 and 119 is a "mode" signal which determines what type of number conversion which is to be performed during a conversion operation. This mode signal could be contained in a microinstruction.

The control signals used in the apparatus of FIG. 5 as well as additional control signals (to be explained), are developed according to the following equations:

$$FFA \leftarrow CNV \cdot \overline{FFA} \tag{10}$$

$$FFB \leftarrow \overline{BQP[MSB]} \tag{11}$$

$$AQW\text{-}CU = CNV \cdot FFA \cdot BQP[MSB] \tag{12}$$

$$BQP\text{-}LD = CNV \cdot FFA \cdot (BMT\text{-}EQ) \tag{13}$$

$$BQP\text{-}CU = CNV \cdot FFA \cdot \overline{(BMT\text{-}EQ)} \tag{14}$$

$$CQW\text{-}LD = CNV \cdot FFA \cdot BQP[MSB] \tag{15}$$

$$CQW\text{-}CU = CNV \cdot FFA \cdot \overline{BQP[MSB]} \tag{16}$$

$$CQP\text{-}LD = CNV \cdot FFA \cdot (BMT\text{-}EQ) \tag{17}$$

$$CQP\text{-}CU = CNV \cdot FFA \cdot \overline{(BMT\text{-}EQ)} \tag{18}$$

$$CVAC = \overline{FFA} + \overline{BQP[MSB]} \tag{19}$$

$$CVBC = FFB + BQP[MSB] \tag{20}$$

Figure 6:
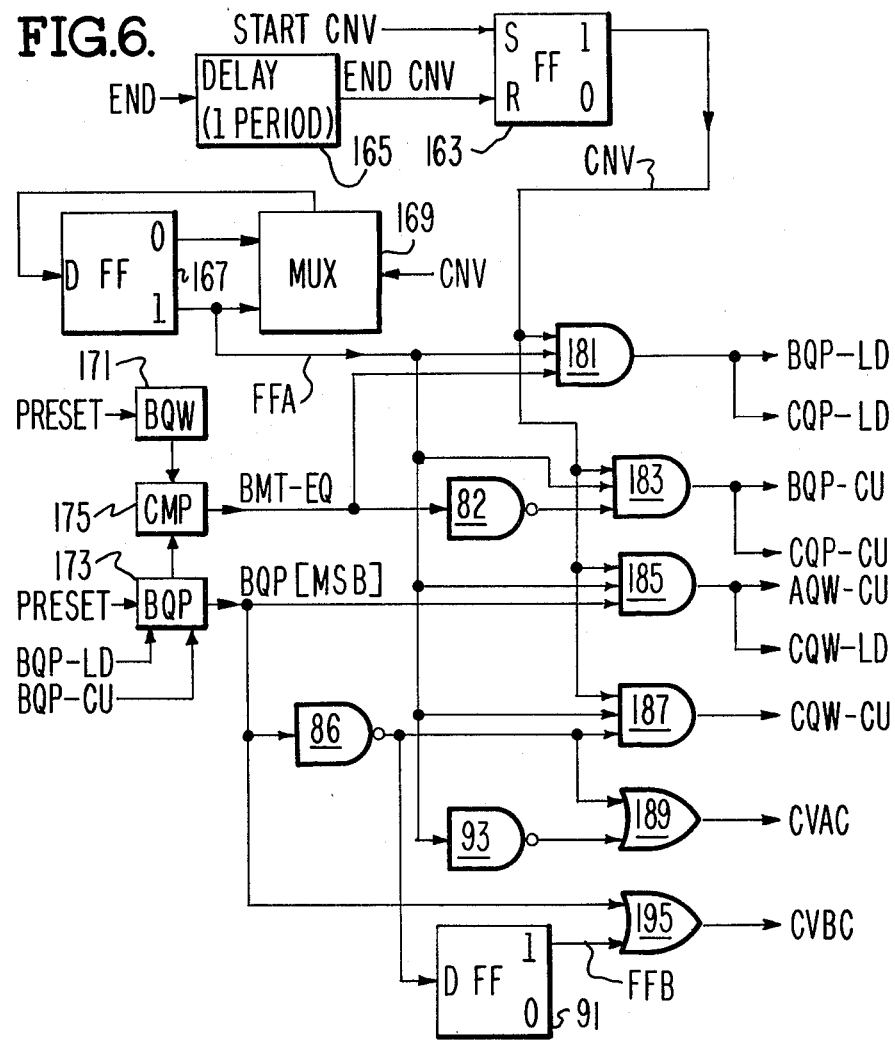
FIG. 6 is a block diagram illustrating how control signals are provided for the embodiment of FIG. 5.

The above equations (10) through (20) for the control signals employed in FIG. 5 are shown implemented in FIG. 6, which will now be considered.

The leading edge of the "start CNV" signal sets RS flip-flop 163 to develop the 1-state CNV signal at its 1 output. When the "END" pulse is generated by AND gate 162 (FIG. 5) (indicating that the write address in AQA register 155 is equal to the preset read address in AQP counter 157), that "END" pulse is delayed for one clock period by delay circuit 165 to produce an "END CNV" pulse which resets the flip-flop 163 to terminate the CNV signal and, hence, the conversion operation.

Figure 7:
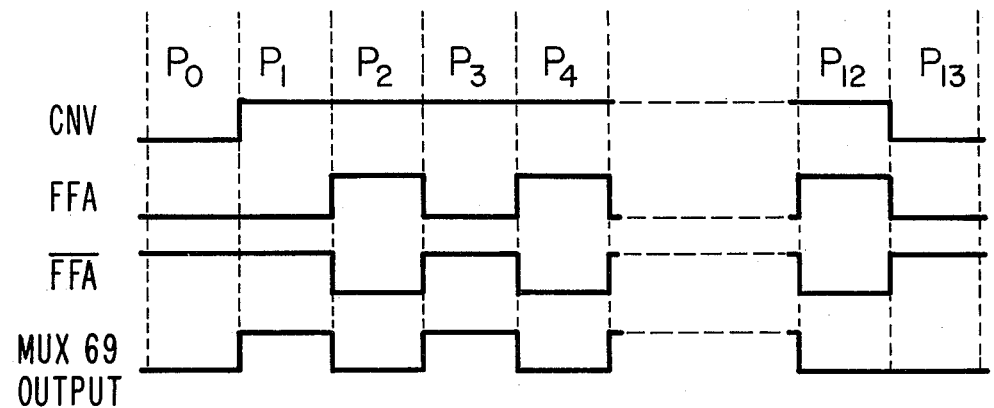
FIGS. 7 and 8 illustrate typical waveforms produced by various components of embodiments of FIGS. 5 and 6.

The development of the FFA signal will now be discussed by referring to both FIGS. 6 and 7. FIG. 7 shows waveforms for CNV, FFA and $\overline{\text{FFA}}$ (the 1 and 0 outputs, respectively, of flip-flop 167) and the multiplexer 169 output to the flip-flop 167, all during clock periods $P_0$, $P_1 \ldots P_{13}$.

The FFA signal is developed at the 1 output of D-flip-flop 167, which has both of its 1 and 0 outputs applied to a multiplexer 169. When CNV=0, multiplexer 169 selects and applies the 1 side of flip-flop 167 back to the D input of the flip-flop. Thus, as indicated in FIG. 7 for period $P_0$ the multiplexer 169 continuously circulates a 0-state FFA output back to the D input of flip-flop 167. However, during the conversion operation which, according to FIG. 6, occurs during periods $P_1$ through $P_{12}$, CNV=1. This 1 state CNV signal enables the multiplexer 169 to feed the 0 side output ($\overline{\text{FFA}}$) of flip-flop 167 back to its D input. As a result, the FFA signal is complemented during the period of the conversion operation (when CNV=1).

A BQW counter 171 and a BQP counter 173 have their outputs compared in a comparator 175. The counters 171 and 173 and comparator 175 are similar in structure and operation to the counters 156 and 157 and comparator 161 previously discussed. The counters BQW 171 and BQP 173 are preset to 00 and to the home position FF, respectively, before a conversion operation begins. The binary states of load signal BQP-LD and count up signal BQP-CU control the count of BQP counter 173 during the conversion operation. When the most significant digit of the output of counter 173 is equal to a binary 1, a 1-state BQP[MSB] signal is generated. When the counts of the counters 171 and 173 are equal to each other, the comparator develops a 1-state BMT-EQ signal.

The CNV, FFA and BMT-EQ signals are applied to AND gate 181 to enable that gate to develop the BQP-LD and CQP-LD control signals. Signal BMT-EQ is also inverted by NAND gate 182 and applied along with the CNV and FFA signals to AND gate 183 to enable the gate 183 to develop the BQP-CU and CQP-CU control signals.

Signals CNV, FFA and BQP[MSB] are applied to AND gate 185 to enable gate 85 to develop the AQW-CU and CQW-LD control signals. The signal BQP[MSB] is also inverted by NAND gate 186 and applied to AND gate 187, OR gate 189 and the input of D-flip-flop 191. The CNV and FFA signals are also applied to AND gate 187 to enable the gate 187 to develop the CQW-CU control signal.

In response to the inverted BQP[MSB] signal, flip-flop 191 develops the FFB control signal at its 1 output. The FFB and BQP[MSB] signals are applied to an OR gate 195 to enable the OR gate to develop the CVBC control signal.

The various terms in the above control signal equations (10) through (20) for FIG. 5 can now be defined as follows:
CNV=the 1 output of flip-flop 163 (FIG. 6)
FFA=the 1 output of flip-flop 167 (FIG. 6)
FFB=the 1 output of flip-flop 197 (FIG. 6)
BQP[MSB]=the most significant bit in the output count of BQP counter 173 (FIG. 6)
(BMT-EQ)=a binary 1 when the counts of the counters BQW 171 and BQP 173 are equal (FIG. 6)

The actions required of the control signals developed in the equations (10) through (20) are as follows:

Eq. (10)—Complement the FFA output of flip-flop 167 each clock period during CNV.
Eq. (11)—Change the FFB output of flip-flop 197 to the complement of the most signficant digit of BQP 173 each clock period during CNV.
Eq. (12)—Count up AQW counter 156 by one on the trailing edge of AQW-CU.
Eq. (13)—Reset the BQP counter 173 to its home position FF on the falling edge of BQP-LD.
Eq. (14)—Count up BQP counter 173 by one on the trailing edge of BQP-CU.
Eq. (15)—Reset CQW counter 134 to its home position FF on the falling edge of CQW-LD.
Eq. (16)—Count up CQW counter 134 by one on the falling edge of CQW-CU.
Eq. (17)—Reset CQP counter 135 to its home position FF on the falling edge of CQP-LD.
Eq. (18)—Count up CQP counter 135 by one on the falling edge of CQP-CU.
Eq. (19)—Enable gate 145 when either FFA or BQP[MSB]=0.
Eq. (20)—Enable gate 151 when either FFB or BQP[MSB]=1.

An example of the operation of the apparatus of FIG. 5 will now be considered for a BCD-to-binary conversion performed using a decimal to hexadecimal conversion, in which case $r_1=10$ and $r_2=16$ for equations (6), (7) and (8) which are implemented by PROMs 15 and 19. For ease of explanation and understanding, the two-character (four digit) decimal input number "0473" will be used for example.

Figure 8:
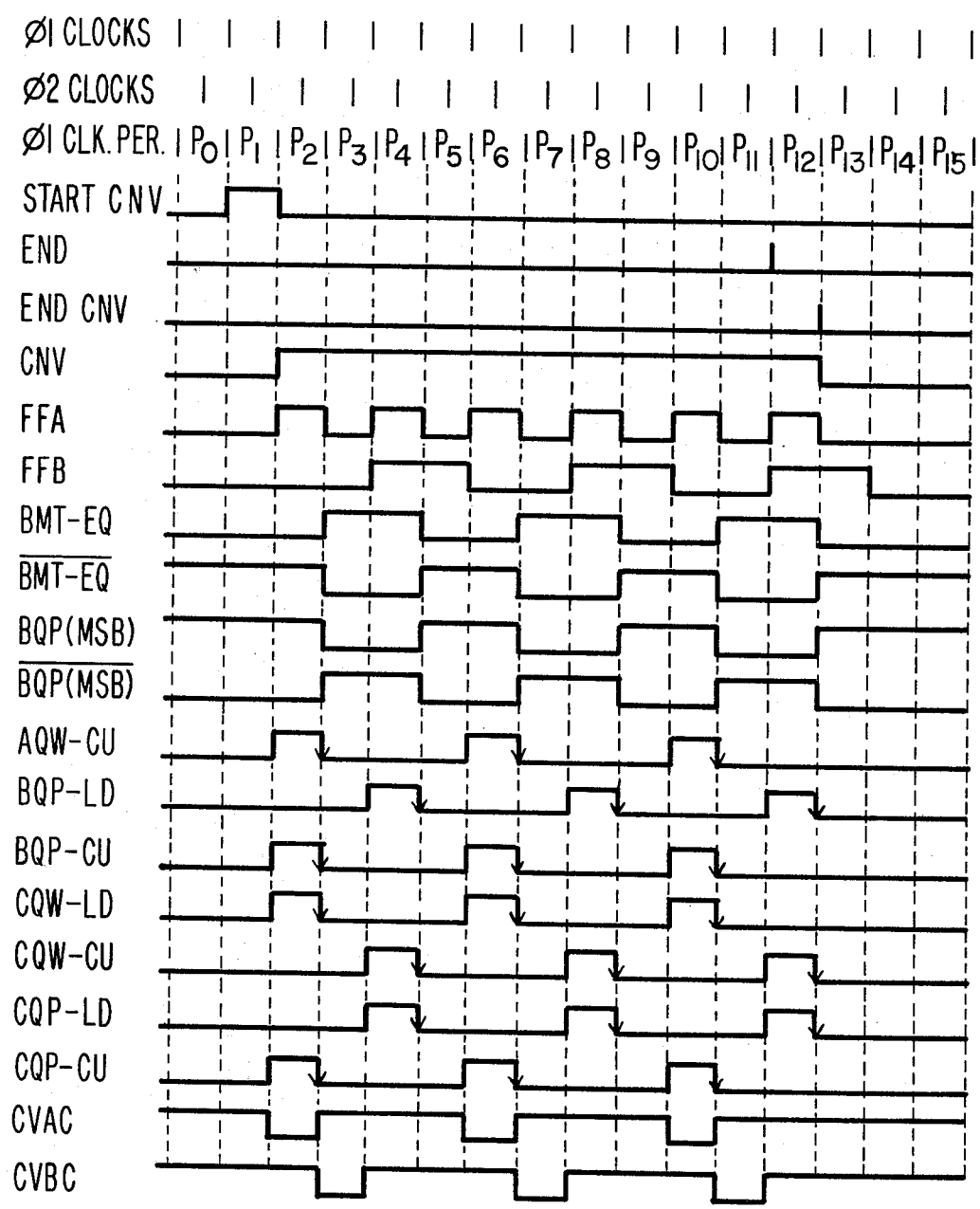

Initially, the waveforms of various signals, as well as the counts of various counters, used in the apparatus of FIG. 5 will be briefly discussed for a two-character (four digit) BCD input number by now referring to FIGS. 8 and 9. It should be understood that the waveforms shown in FIG. 8 and the counts of the various counters and registers used in the invention, that are shown in FIG. 9, would be different for input BCD numbers having different numbers of digits as well as for different types of conversions.

In FIG. 8, the $\phi 1$ and $\phi 2$ clocks are shown for $\phi 1$ clock periods $P_0$, $P_1 \ldots P_{15}$. The "start CNV" signal occurs at the end of the period $P_0$ to start the generation of the CNV signal or gate. For the two-character long number conversion, the "END" pulse is not generated by AND gate 162 until the end of the period $P_{11}$. As a result, the "end CNV" pulse terminates the CNV gate, and hence the conversion operation, at the end of period $P_{12}$. Thus, the conversion operation lasts for the duration of the CNV gate, namely during the twelve clock periods $P_1$–$P_{12}$.

It is the initial address counts of the counters AQW 156, AQP 157, BQW 171, BQP 173, CQW 134 and CQP 135 and registers AQA 155 and CQA 132 before a CNV period starts ($P_0$) and their subsequent address counts during a CNV period ($P_1 \ldots P_{12}$) which controls the number conversion operation of the invention.

As shown in FIG. 9 and discussed previously, during the clock period $P_0$ (which occurs sometime after the storage of a two-character input number in the RAM 136 and before a CNV period starts) counter CQW 134 has an address count of 01 (indicative of two characters in the input number); register CQA 132 contains a write address of 01 (from the prior count of counter CQW 134); counter AQP has an address count of FD (like the count of counter CQW 134 which is equal to two positions from its home position FF; counters AQW 156, BQW 171, BQP 173 and CQP 135 have been preset to contain address counts of 00, 00, FF and FF, respectively; and register AQA 155 contains a write address of 00 (from the prior count of counter AQW 156).

Values of the remaining control signals shown in FIG. 8 determine the subsequent address counts of the counters 156, 157, 171, 173, 134 and 135 and registers 155 and 132 shown in FIG. 6 during the CNV period ($P_1 \ldots P_{12}$) and after the CNV period ($P_{13} \ldots P_{15} \ldots$). The values of the FFA, FFB, AQW-CU, BQP-LD, BQP-CU, CQW-LD, CQW-CU, CQP-LD, CQP-CU, CVAC, CVBC signals shown in FIG. 5 have been derived from the above FIG. 5 control equations (10) through (20) for the clock periods $P_1 \ldots P_{15}$. The waveforms for the BMT-EQ and BQP[MSB] signals and their negations, which are also shown in FIG. 8, are elements of equations (2) through (11) and are derived from the counts of the counters BQW 171 and BQP 173 for the clock periods $P_1 \ldots P_{15}$. Signal BMT-EQ is equal to a binary 1 when BQW-BQP which, as seen in FIG. 9, occurs during clock periods $P_3$, $P_4$, $P_7$, $P_8$, $P_{11}$ and $P_{12}$. Signal BQP[MSB] is equal to a binary 0 when the most significant digit of BQP=0 which, as also seen in FIG. 6, occurs during clock periods $P_3$, $P_4$, $P_7$, $P_8$, $P_{11}$ and $P_{12}$.

For the sake of consistency and ease of understanding, assume that each counter changes its count on the falling edge of a control signal applied thereto (as indicated in FIGS. 8 and 9) and that (other than flip-flop 163 in FIG. 6) each storage device, such as a flip-flop, register or RAM, clocks input data in on the clocked trailing edge of that input data.

Figures 10, 10A:
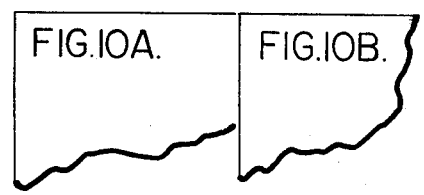

Referring now to FIG. 10, illustrated therein is the conversion of the two-character, four digit input BCD number 0473 (0000 0100 0111 0011) into its equivalent binary coded hexademical number 01D9 (0000 0001 1101 1001) in accordance with equations (1), (6), (7) and (8) set forth earlier herein and the examples illustrated in Tables 4 and 5. FIG. 10 illustrates the results obtained from the various operations performed by the circuits of FIG. 5 during the pre-conversion operation clock period $P_0$, the conversion clock periods $P_1 \ldots P_{12}$ and the post-conversion clock periods $P_{13} \ldots P_{15}$. Also, each X in FIG. 10 represents a "don't care" or "garbage" digit, which has "don't care" values.

Periods $P_0$ and $P_1$

During each of periods $P_0$ and $P_1$, the following described events occur. The characters 04 and 73 of the previously written-in input BCD number 0473 (0000 0100 0111 0011) are respectively contained in address locations FF and 00 of the CQ RAM 136. As shown in FIG. 9, the write (W) address in register CQA 132 and the read (R) address of counter CQP 135 are 01 and FF, respectively. An XX (don't care) character is read into location 01 of RAM 136 during the write portion of a write-read cycle (which uses both of phase clocks $\phi 1$ and $\phi 2$). This 01 RAM location is reserved for "garbage" characters. Similarly, the write (W) address of RAM 159 from register AQA 155 is 00 (FIG. 9) to enable RAM 159 to store an XX character in its preselected "garbage" location 00 during the write portion of a write-read cycle. The 04 character in location FF of RAM 136 is read out during the following read portion of the write-read cycle. However, all other digits and characters occurring in other circuit components of FIG. 5 are X and XX, respectively.

Period $P_2$

During period $P_2$, the "0" and "4" digits of the more significant input BCD character 04 (0000 0100) read out of location FF of RAM 136 during period $P_1$, respectively reside in the CQOU and CQOL portions of register CQO 133 during $P_2$ and thus appear at the two inputs of multiplexer 143. During $P_2$ the FFA signal, which controls the operation of the multiplexer 143, is in a 1-state (FIG. 8). As a result, the multiplexer 143 selects the digit "0" from the CQOL portion of CQO register 133 for use as the $d_k$ input for PROM 115. An X (don't care) digit from the BQIL portion of register 117 is applied to the input of gate 145. However, during period $P_2$, the 0 state CVAC signal (FIG. 8) disables the gate 145, causing the gate 145 to develop an $f_{k-1}=0$ digit for PROM 115. Since, during period $P_2$, $f_{k-1}=0$ and $d_k=0$ for PROM 115, the PROM 115, in accordance with equations (6), (7) and (8), produces outputs of $q_k=0$ and $f_k=0$ as indicated in FIG. 10.

Also during period $P_2$, the write address of RAM 159 remains 00, and during the read portion of the write-read cycle, the 04 character is again read out of location FF of RAM 136. All other digits and characters produced by other circuit components of FIG. 2 are X and XX, respectively.

Period $P_3$

During period $P_3$, the write addresses of RAMs 136 and 159 remain 01 and 00, respectively. "Don't care" characters XX and XX from register CQI 131 and AQI 149 are therefore stored in location 01 of RAM 136 and location 00 of RAM 159. The "0" and "4" BCD digits of the 04 character, which were read out of location FF of RAM 136 during period $P_2$, again respectively reside in the CQOU and CQOL portions of register CQO 133 during $P_3$ and thus again appear at the two inputs of multiplexer 143. However, during period $P_3$, the 0-state FFA signal (FIG. 8) enables the multiplexer 143 to now select the digit "4" from the CQOU portion of register 133 as a $d_k=4$ input for PROM 115. The $q_k=0$ and $f_k=0$ digits developed by PROM 115 during the previous period $P_2$ are respectively stored in the BQIU and BQIL portions of register 117 during $P_3$. The "0" digit from the BQIL portion of register 117 is passed through gate 145 (which is enabled during $P_3$ by the 1-state CVAC signal as shown in FIG. 8) for use as an $f_{k-1}=0$ input for PROM 115. In accordance with equations (6), (7) and (8), the PROM 115 thus operates during $P_3$ in response to inputs $d_k=4$ and $f_{k-1}=0$ produce $q_k=0$ and $f_k=4$ outputs.

Also during $P_3$, the "0" digit from the BQIU portion of register 117 is used as a $q_k=0$ input for PROM 119. An X stored in the AQIU portion of register AQI 149 is applied to the input of gate 151. However, during period $P_3$, the 0-state CVBC signal (FIG. 8) disables the gate 151 causing the gate 151 to develop a "0" output digit. The 0 output digit of gate 151 thus provides an $f_{k-1}=0$ input for PROM 119. In response to these $q_k=0$ and $f_{k-1}=0$ inputs applied during $P_3$, the PROM 119 produces outputs of $q_k=0$ and $f_k=0$ during $P_3$. The $q_k=0$ output of PROM 119 produced during $P_3$ is stored in CVR register 53 during $P_3$ as well as in the CQIL portion of register 131. The $f_k=0$ output of PROM 119 produced during $P_3$ is stored in the AQIU portion of register 149.

Also during period $P_3$, the read address of RAM 136 changes to 00. Consequently, during the read portion of the write-read cycle of period $P_3$, the "7" and "3" digits of the less significant input BCD character 73 (0111 0011) are read out of location 00 of the RAM 136 into CQOU and CQOL, respectively, of register 133.

Period $P_4$

At the start of period $P_4$, the write address of RAM 136 from the register CQA 132 changes to FF, while the write address of RAM 159 from register 155 also changes to FF, as shown in FIG. 9. Also, the X and "0" digits residing in the CQIU and CQIL portions of register 131 during $P_4$ are written into location FF of RAM 136 for subsequent use as $d_k$ digits to PROM 115 after operations have been completed on the input number. Also during period $P_4$, the "0" digits residing in the AQIU and AQIL portions of register 149 during $P_3$ are written into location FF of the AQ RAM 159.

The BCD digits "7" and "3" of the input number which were read out of location 00 of RAM 136 during period $P_3$ and respectively stored in the CQOU and CQOL portions of register CQO 133 and are applied during $P_4$ as inputs to multiplexer 143. During period $P_4$, the 1-state FFA signal (FIG. 5) enables the multiplexer 143 to select the digit "7" from the CQOU portion of register CQO 133 as the $d_k$ input for the PROM 115. The $q_k=0$ and $f_k=0$ digits produced by PROM 115 during the previous period $P_3$, are respectively stored in the BQIU and BQIL portions of register 117. The digit "4" from the BQIL portion of delay register 117 passes through gate 145 (which is still enabled by the 1-state CVAC signal (FIG. 5) during period $P_4$). This digit "4" from the gate 145 is the $f_{k-1}$ value that is applied to the PROM 115 during period $P_4$. Accordingly, in response to these $d_k=7$ and $f_{k-1}=7$ inputs, PROM 115 produces outputs of $q_k=2$ and $f_k=F$ during $P_4$.

The digit "0" from the BQIU portion of register 117 is the $d_k$ value that is applied to the PROM 119 during period $P_4$. The $f_{k-1}$ input applied to PROM 119 during $P_4$ is the digit "0" now residing in the AQIU portion of register AQI 149 which passes to PROM 119 through gate 151 which is enabled by the 1-state CVBC signal (FIG. 8) during period $P_4$. Accordingly, in response to $q_k=0$ and $f_{k-1}=0$ inputs, PROM 119 produces $q_k=0$ and $f_k=0$ outputs during $P_4$.

Also, during the read portion of the write-read cycle of period $P_4$, the "7" and "3" digits of the input number are again read out of location 00 of the RAM 136 and stored in CQOU and CQOL, respectively, of register 133.

Period $P_5$

During period $P_5$, each of the write addresses of the RAMs 136 and 159 from registers CQA 132 and AQA 155 remains FF, while the read address of the RAM 136 from counter CQP 135 changes to FF, as shown in FIG. 9. The consecutive $q_k$ digits "0" and "0" respectively produced by PROM 119 during $P_3$ and $P_4$ now reside in the CQIU and CQIL portions of register CQI 131 during $P_5$. Accordingly, these $q_k$ digits are written into location FF of RAM 135 during $P_5$. Also during period $P_5$, the $f_k=0$ digit produced by PROM 119 during $P_4$ and the $f_{k-1}=4$ digit from BQIL reside in the AQIU and AQIL portions of register 149 during $P_5$ and are thus written into location FF of RAM 159 during $P_5$.

The BCD digits "7" and "3" read out of location 00 of RAM 136 reside in the CQOU and CQOL portions of register CQO 33 during $P_5$ and are applied to the multiplexer 143 which, in response to the 0-state FFA signal (FIG. 5), now selects the digit "3" from the CQOL portion of register CQO 133 as the $d_k$ input for PROM 115 during $P_5$. The digits "2" and "F" developed by PROM 115 during the previous period $P_4$, respectively reside during $P_5$ in the BQIU and BQIL portions of register 117. During $P_5$, the digit "F" from the BQIL portion of register 117 passes through gate 145 (which is still enabled by the 1-state CVAC signal (FIG. 5) to provide an $f_{k-1}=F$ input for PROM 115 during period $P_5$. In response to these inputs of $d_k=3$ and $f_{k-1}=F$, PROM 115 produces outputs of $q_k=9$ and $f_{k-1}=9$.

As for the operation of PROM 119 during $P_5$, the digit "2" from the BQIU portion of register 117 is the $d_k$ input that is applied to the PROM 119 during period $P_5$ and the digit "0" residing in the AQIU portion of register AQI 149 during $P_5$ passes through gate 151 to become the $f_{k-1}$ value that is applied to PROM 119 during period $P_5$. In response to these $d_k=2$ and $f_{k-1}=0$ inputs, PROM 119 produces outputs of $q_k=0$ and $f_k=2$ during $P_5$.

During the read portion of the write-read cycle of period $P_5$, "0" and "0" digits are read out of location FF of the RAM 136 and stored in CQOU and CQOL, respectively, of register 133. It will be remembered that these digits are the first two $q_k$ digits previously produced by PROM 119, during $P_3$ and $P_4$, respectively, and are now ready to be respectively applied as $d_k$ inputs to PROM 115 during periods $P_6$ and $P_7$, since PROM 115 completes operations on the input number 0473 during $P_5$.

Periods $P_6$ Through $P_{12}$

The conversion operation continues during periods $P_6$ through $P_{12}$ of the conversion operation in basically the same manner as previously described in each of periods $P_4$ and $P_5$. With reference to FIGS. 5, 8 and 10, note that an $f_{k-1}=0$ value is produced at the output of gate 145 during each of periods $P_6$ and $P_{10}$, since the gate 145 is disabled by a 0-state of the CVAC signal during those periods. Note also that an $f_{k-1}=0$ value is also produced at the output of gate 151 during each of periods $P_7$ and $P_{11}$, since the gate 151 is disabled by a 0-state of the CVBC signal during those periods. It will be understood that this $f_{k-1}=0$ value is produced for these clock periods in order to provide a proper initial $f_{k-1}=0$ at the start of each next serial division to be performed by PROM 115 or PROM 119.

It will also be understood that, during period $P_7$, the digits residing in respective AQIU and AQIL portions of register 149 will be the two least significant hexadecimal digits D9 of the converted number. These digits D9 are written into location FF of AQ RAM 159 during $P_7$. At the start of period $P_8$ the write address of the RAM 159 from register AQA 155 changes to FE to prevent any subsequent writing over these stored hexadecimal digits D9. The write address of RAM 159 remains FE through periods $P_8$, $P_9$, $P_{10}$ and $P_{11}$. During period $P_{11}$ the two more significant hexadecimal digits 01 of the converted number are written into location FE of AQ RAM 159. At the start of period $P_{12}$ the write address of RAM 159 from register AQA 155 changes to the next address FD to prevent any subsequent writing over these stored hexadecimal digits 01. The write address of RAM 159 remains FE through period $P_{12}$.

For a four digit decimal input number, the CNV gate, and hence the conversion operation, terminates at the end of period $P_{12}$. During subsequent periods, such as period $P_{13}$, the apparatus of FIG. 2 generates "don't care" digits. The hexadecimal digits of the converted number 01D9 are respectively stored in the two locations FF and FE of the AQ RAM 159, and may be read out of the RAM 159 in binary or hexadecimal form as needed.

It is to be noted that the maximum input decimal number that can be used in a two-character (four digit) conversion operation such as illustrated by FIG. 5 is 9999. The equivalent hexadecimal number for decimal number 9999 is 270F. Therefore, no problem is encountered in such a BCD-to-binary conversion, since the conversion of a four digit input BCD number will produce a four digit output hexadecimal number. This was the case in relation to FIG. 10. For purposes of FIG. 10, with a four digit input decimal number the counter AQP 157 was preset to FD. This preset of counter 157 to FD resulted in the termination of the CNV gate, and hence the conversion operation, at the end of the first period ($P_{12}$) during which the comparator 161 produced an "END CNV" pulse. At that time the complete converted hexadecimal number 01D9 was stored at addresses FF and FE of RAM 159.

While the salient features of the invention have been illustrated and described, it should be readily apparent to those skilled in the art that many changes and modifications in construction, arrangement and use can be made in the forms of the invention presented without departing from the spirit and true scope of the invention. Accordingly, the present invention is to be considered as encompassing all possible changes and modifications coming within the broad scope of the invention as defined by the appended claims.

What is claimed is:

1. Electrical apparatus for converting an input number in a first number system of radix $r_1$ into an equivalent output number in a second number system of radix $r_2$ comprising:

input circuit means for receiving input electrical signals representing said input number in said first number system; and electrically operable conversion means responsive to said input electrical signals for producing output electrical signals representing said equivalent number in said second number system by performing a plurality of successive divisions in accordance with the divide-by-radix iterative equation:

$$\frac{Q_{j-1}}{r_2} = Q_j + b_j$$

where $j = 1, 2, \ldots n$, where $Q_0$ is said input number in said first number system, where $r_2$ is radix $r_2$ expressed in said first number system, where $Q_j$ is the quotient of the jth division, where n is the number for which the quotient $Q_j = 0$, where $b_j$ is the remainder of the jth division and is also a digit of said equivalent output number in said second number system, and where said equivalent output number in said second number system is formed by assembling the $b_j$ remainders as $b_n \ldots b_2, b_1$ with $b_1$ being the least significant digit;

said conversion means including serial division circuit means for performing each of the divisions required by said divide-by-radix iterative equation using electrical signal representations for the values in said equation and the outputs obtained therefrom, said serial division circuit means including a first serial divider to which the digits of an input number $Q_{j-1}$ are serially applied as dividend digits beginning with the most significant dividend digit, said first serial divider being responsive to these serially applied dividend digits so as to serially produce output quotient digits of the quotient $Q_j$ in accordance with said equation beginning with the most significant output quotient digit and for also producing a final remainder digit $b_j$ corresponding to a digit of said equivalent number in said second number system;

said serial division means also including a second serial divider connected so as to serially receive and serially operate on the output quotient digits produced by said first serial divider beginning with the most significant quotient digit.

2. The invention in accordance with claim 1, wherein each serial divider comprises a PROM programmed in accordance with said equation.

3. The invention in accordance with claim 2, wherein said serial division means comprises a plurality of serial dividers including a first serial divider and a last serial divider, each serial divider operating in the same manner as said at least one serial divider, said serial dividers being successively connected so that each serial divider except said first serial divider serially receives and operates on the output quotient digits produced by the immediately preceding serial divider beginning with the most significant quotient digit, and wherein said first serial divider is initially caused to serially receive and operate on the digits of the input number to be converted beginning with the most significant digit of the input number and upon completion of operations on the last digit of the input number is then caused to serially receive and operate on the output digits produced by the last serial divider beginning with the most significant quotient digit.

4. The invention in accordance with claim 1, 2 or 3, wherein said serial dividers are adapted to operate concurrently on the respective input digits applied thereto.

5. The invention in accordance with claim 1, 2 or 3, wherein each serial divider is adapted to respond to each serially applied digit $d_k$ of the applied $Q_{j-1}$ number and an input digit remainder $f_{k-1}$ for producing a corresponding output quotient digit $q_k$ and an output digit remainder $f_k$ in accordance with the equations:

$$i_k = r_1 f_{k-1} + d_k$$

$$q_k = i_k / r_2$$

$$f_k = i_k = r_2 q_K$$

where $k = k\text{-}1, 2, \ldots m$ and m is the number of input $d_k$ digits in the applied number $Q_{j-1}$, and wherein said serial division means is adapted to provide each input $f_{k-1}$ value for each serial divider in a manner such that $f_{k-1}$ is zero for the first input digit $d_1$ and for the remaining input digits $d_2\text{-}d_m$ is equal to the value of the output $f_k$ value obtained for the previous input digit applied to the serial divider, and wherein each $b_j$ digit is equal to the final remainder digit $f_m$ obtained for the last digit $d_m$ of the applied input number $Q_{j-1}$.

6. The invention in accordance with claim 4, wherein the number of serial dividers provided is equal to the maximum number of digits contained in the input number to be converted.

7. The invention in accordance with claim 5, wherein said serial division means includes means for delaying each digit remainder $f_k$ outputted by a serial divider so as to provide the $f_{k-1}$ input required by this serial divider for use with the next input digit.

8. The invention in accordance with claim 5, wherein said conversion means includes means for selecting final remainder digits $b_j$ produced by said serial dividers for use as digits of said equivalent number in said second number system.

9. The invention in accordance with claim 5 wherein each serial divider is a PROM responsive to $d_k$ and $f_{k-1}$ inputs for producing $q_k$ and $f_k$ outputs.

10. The invention in accordance with claim 5, wherein the input number to be converted is a binary coded decimal number (radix 10) and the equivalent output number is a binary number (radix 2), wherein said conversion means is adapted to operate on the binary coded decimal input number with radix values of $r_1=10$ and $r_2=16$ so as to produce an equivalent binary coded hexadecimal number (radix 16) for outputting in binary form.

11. The invention in accordance with claim 2 or 3, wherein each PROM is programmed to provide serial division for a plurality of different radix values, and wherein means are provided for causing each PROM to perform serial division for a particular selected radix.

* * * * *

UNITED STATES PATENT AND TRADEMARK OFFICE
CERTIFICATE OF CORRECTION

PATENT NO. : 4,342,027

DATED : July 27, 1982

INVENTOR(S) : Lawrence G. Hanson

It is certified that error appears in the above-identified patent and that said Letters Patent are hereby corrected as shown below:

Col. 3, line 8, change "$g_k$" to --$q_k$--;

Col. 3, line 17, change "$g_k$," to --$q_k$,--;

Col. 3, line 22, change "$g_k$" to --$q_k$--;

Col. 3, line 24, change "$vg_k$" to --$vq_k$--;

Col. 3, line 40, change "$-r_2 g_k$" to -- $-r_2 q_k$ --.

Col. 9, line 36, change "corresonding" to --corresponding--.

Col. 10, line 24, change "$g_k = 1$" to --$q_k = 1$--.

Signed and Sealed this

Twenty-first Day of September 1982

[SEAL]

Attest:

GERALD J. MOSSINGHOFF

Attesting Officer

Commissioner of Patents and Trademarks